(12) United States Patent  
Zahnert et al.

(10) Patent No.: US 11,902,677 B2
(45) Date of Patent: Feb. 13, 2024

(54) PATCH TRACKING IMAGE SENSOR

(71) Applicant: Magic Leap, Inc., Plantation, FL (US)

(72) Inventors: Martin Georg Zahnert, Zurich (CH); Alexander Ilic, Zurich (CH); Erik Fonseka, Mountain View, CA (US)

(73) Assignee: Magic Leap, Inc., Plantation, FL (US)

(*) Notice: Subject to any disclaimer, the term of this patent is extended or adjusted under 35 U.S.C. 154(b) by 0 days.

(21) Appl. No.: 17/293,014

(22) PCT Filed: Oct. 30, 2019

(86) PCT No.: PCT/US2019/058810
§ 371 (c)(1),
(2) Date: May 11, 2021

(87) PCT Pub. No.: WO2020/101892
PCT Pub. Date: May 22, 2020

(65) Prior Publication Data
US 2021/0409626 A1 Dec. 30, 2021

Related U.S. Application Data

(60) Provisional application No. 62/759,991, filed on Nov. 12, 2018.

(51) Int. Cl.
H04N 25/50 (2023.01)
G06T 11/00 (2006.01)
H04N 25/702 (2023.01)

(52) U.S. Cl.
CPC ............ H04N 25/50 (2023.01); G06T 11/00 (2013.01); H04N 25/702 (2023.01)

(58) Field of Classification Search
CPC ...... H04N 5/351; H04N 5/3696; G06T 11/00; G02B 27/017; G06F 3/011; G06F 3/012;
(Continued)

(56) References Cited

U.S. PATENT DOCUMENTS 6,226,388 B1 * 5/2001 Qian ................. G06T 7/246
382/103
6,271,785 B1 8/2001 Martin et al.
(Continued)

FOREIGN PATENT DOCUMENTS

WO WO 2007/069892 A1 6/2007
WO WO 2012/022927 A1 2/2012
WO WO 2016/181391 A1 11/2016

OTHER PUBLICATIONS

International Search Report and Written Opinion for Application No. PCT/US2019/058807 dated Feb. 21, 2020.
(Continued)

Primary Examiner — Lin Ye
Assistant Examiner — Chan T Nguyen
(74) Attorney, Agent, or Firm — Wolf, Greenfield & Sacks, P.C.

(57) ABSTRACT

An image sensor suitable for use in an augmented reality system to provide low latency image analysis with low power consumption. The augmented reality system can be compact, and may be small enough to be packaged within a wearable device such as a set of goggles or mounted on a frame resembling ordinary eyeglasses. The image sensor may receive information about a region of an imaging array associated with a movable object and selectively output imaging information for that region. The region may be updated dynamically as the image sensor and/or the object moves. Such an image sensor provides a small amount of data from which object information used in rendering an augmented reality scene can be developed. The amount of data may be further reduced by configuring the image sensor to output indications of pixels for which the measured intensity of incident light changes.

19 Claims, 13 Drawing Sheets

(58) Field of Classification Search
CPC .............. G06F 3/147; G09G 2360/144; G09G 2380/08; H01L 27/14609
USPC ...................................................... 348/222.1
See application file for complete search history.

(56) References Cited

U.S. PATENT DOCUMENTS

| | | | |
|---|---|---|---|
| 9,529,192 | B2 | 12/2016 | Border |
| 9,826,176 | B1 | 11/2017 | Vogelsang |
| 9,990,761 | B1 | 6/2018 | Anderson et al. |
| 10,152,775 | B1 | 12/2018 | Bellows et al. |
| 10,345,447 | B1* | 7/2019 | Hicks ................... G01S 7/4863 |
| 11,269,402 | B1 | 3/2022 | Canberk et al. |
| 2001/0025914 | A1 | 10/2001 | Pyyhtia et al. |
| 2002/0005485 | A1 | 1/2002 | Hashimoto et al. |
| 2003/0174146 | A1 | 9/2003 | Kenoyer |
| 2008/0252723 | A1* | 10/2008 | Park ......................... G06T 7/238 348/143 |
| 2009/0109313 | A1 | 4/2009 | Liu et al. |
| 2010/0020254 | A1* | 1/2010 | Geng ................... G03B 21/006 353/7 |
| 2012/0091372 | A1 | 4/2012 | Molnar et al. |
| 2012/0236124 | A1 | 9/2012 | Aoki |
| 2013/0063400 | A1 | 3/2013 | Ahn et al. |
| 2013/0076953 | A1 | 3/2013 | Sekine et al. |
| 2013/0126703 | A1 | 5/2013 | Caulfield |
| 2014/0326854 | A1 | 11/2014 | Delbruck et al. |
| 2014/0375820 | A1* | 12/2014 | Priyantha ............... H04N 7/188 348/169 |
| 2015/0062003 | A1 | 3/2015 | Rafii et al. |
| 2015/0228114 | A1 | 8/2015 | Shapira et al. |
| 2015/0243105 | A1 | 8/2015 | Abovitz et al. |
| 2015/0248551 | A1* | 9/2015 | Bae ........................ G06F 21/36 726/30 |
| 2015/0260474 | A1 | 9/2015 | Rublowsky et al. |
| 2015/0302658 | A1 | 10/2015 | O'Connor et al. |
| 2015/0365617 | A1 | 12/2015 | Chen |
| 2015/0381889 | A1* | 12/2015 | Toguchi ................. H04N 23/45 348/207.11 |
| 2016/0026253 | A1 | 1/2016 | Bradski et al. |
| 2016/0148433 | A1 | 5/2016 | Petrovskaya et al. |
| 2016/0187969 | A1 | 6/2016 | Larsen et al. |
| 2016/0191887 | A1 | 6/2016 | Casas |
| 2016/0262608 | A1 | 9/2016 | Krueger |
| 2016/0309134 | A1 | 10/2016 | Venkataraman et al. |
| 2016/0335487 | A1 | 11/2016 | Ming et al. |
| 2016/0360970 | A1 | 12/2016 | Tzvieli et al. |
| 2017/0094243 | A1 | 3/2017 | Venkataraman et al. |
| 2017/0167920 | A1* | 6/2017 | Lee ....................... G01J 3/0264 |
| 2017/0168586 | A1 | 6/2017 | Sinha et al. |
| 2017/0176575 | A1 | 6/2017 | Smits |
| 2017/0227841 | A1 | 8/2017 | Niemela et al. |
| 2017/0285343 | A1 | 10/2017 | Belenkii et al. |
| 2017/0302859 | A1 | 10/2017 | Nakanishi et al. |
| 2017/0345218 | A1 | 11/2017 | Bedikian et al. |
| 2017/0345398 | A1 | 11/2017 | Fuchs et al. |
| 2017/0374360 | A1 | 12/2017 | Kranski et al. |
| 2018/0068206 | A1* | 3/2018 | Pollach .................. G06V 20/56 |
| 2018/0115763 | A1 | 4/2018 | Hung et al. |
| 2018/0182173 | A1 | 6/2018 | Robaina et al. |
| 2018/0188538 | A1 | 7/2018 | Bell |
| 2018/0239144 | A1 | 8/2018 | Woods et al. |
| 2018/0249151 | A1 | 8/2018 | Freeman et al. |
| 2018/0278843 | A1 | 9/2018 | Smith et al. |
| 2018/0300897 | A1 | 10/2018 | Woods et al. |
| 2019/0056792 | A1 | 2/2019 | Wan et al. |
| 2019/0139307 | A1* | 5/2019 | Min ........................ A63F 13/53 |
| 2019/0197765 | A1 | 6/2019 | Molyneaux et al. |
| 2019/0317597 | A1 | 10/2019 | Aleem et al. |
| 2019/0355169 | A1 | 11/2019 | Sapienza et al. |
| 2021/0165229 | A1 | 6/2021 | Stahl et al. |
| 2021/0409629 | A1 | 12/2021 | Zahnert et al. |
| 2021/0409632 | A1 | 12/2021 | Zahnert et al. |
| 2022/0014689 | A1 | 1/2022 | Zahnert et al. |
| 2022/0051441 | A1 | 2/2022 | Zahnert et al. |

OTHER PUBLICATIONS

Invitation to Pay Additional Fees for Application No. PCT/US2019/058807 dated Dec. 13, 2019.
International Preliminary Report on Patentability for Application No. PCT/US2019/058807 dated May 20, 2021.
International Search Report and Written Opinion for Application No. PCT/US2019/058810 dated Feb. 24, 2020.
Invitation to Pay Additional Fees for Application No. PCT/US2019/058810 dated Dec. 13, 2019.
International Preliminary Report on Patentability for Application No. PCT/US2019/058810 dated May 20, 2021.
International Search Report and Written Opinion for Application No. PCT/US2019/058838 dated Feb. 27, 2020.
Invitation to Pay Additional Fees for Application No. PCT/US2019/058838 dated Dec. 17, 2019.
International Preliminary Report on Patentability for Application No. PCT/US2019/058838 dated May 20, 2021.
International Search Report and Written Opinion for Application No. PCT/US2019/060791 dated Mar. 10, 2020.
Invitation to Pay Additional Fees for Application No. PCT/US2019/060791 dated Jan. 13, 2020.
International Preliminary Report on Patentability for Application No. PCT/US2019/060791 dated May 27, 2021.
Invitation to Pay Additional Fees for Application No. PCT/US2019/067476 dated Feb. 27, 2020.
International Search Report and Written Opinion for Application No. PCT/US2019/067476 dated Apr. 29, 2020.
International Preliminary Report on Patentability for Application No. PCT/US2019/067476 dated Jul. 1, 2021.
Invitation to Pay Additional Fees for Application No. PCT/US2020/017119 dated Apr. 23, 2020.
International Search Report and Written Opinion for Application No. PCT/US2020/017119 dated Jun. 23, 2020.
International Preliminary Report on Patentability for Application No. PCT/US2020/017119 dated Aug. 19, 2021.
International Search Report and Written Opinion for Application No. PCT/US2020/017121 dated May 7, 2020.
International Preliminary Report on Patentability for Application No. PCT/US2020/017121 dated Aug. 19, 2021.
Detone et al., Deep image homography estimation. arXiv preprint. arXiv:1606.03798. Jun. 13, 2016. 6 pages.
Zahnert et al., Multi-Camera Cross Reality Device, U.S. Appl. No. 17/415,699, filed Jun. 17, 2021.
Zahnert et al., Lightweight Cross Reality Device With Passive Depth Extraction, U.S. Appl. No. 17/428,948, filed Aug. 5, 2021.
Zahnert et al., Lightweight And Low Power Cross Reality Device With High Temporal Resolution, U.S. Appl. No. 17/428,958, filed Aug. 5, 2021.

* cited by examiner

PATCH TRACKING IMAGE SENSOR

RELATED APPLICATIONS

This Application is a national stage filing under 35 U.S.C. § 371 of International Patent Application Serial No. PCT/US2019/058810, filed Oct. 30, 2019, entitled "PATCH TRACKING IMAGE SENSOR," which claims priority under 35 U.S.C. § 119(e) to U.S. Provisional Application Ser. No. 62/759,991, filed Nov. 12, 2018, entitled "PATCH TRACKING IMAGE SENSOR." The entire contents of these applications are incorporated herein by reference in their entirety.

TECHNICAL FIELD

This application relates generally to methods and apparatus for low-latency motion and/or low-power processing of image information.

BACKGROUND

Computers may control human user interfaces to create an X Reality (XR or cross reality) environment in which some or all of the XR environment, as perceived by the user, is generated by the computer. These XR environments may be virtual reality (VR), augmented reality (AR), or mixed reality (MR) environments, in which some or all of an XR environment may be generated by computers using, in part, data that describes the environment. This data may describe, for example, virtual objects that may be rendered in a way that users sense or perceive as a part of a physical world such that users can interact with the virtual objects. The user may experience these virtual objects as a result of the data being rendered and presented through a user interface device, such as, for example, a head-mounted display device. The data may be displayed to the user to see, or may control audio that is played for the user to hear, or may control a tactile (or haptic) interface, enabling the user to experience touch sensations that the user senses or perceives as feeling the virtual object.

XR systems may be useful for many applications, spanning the fields of scientific visualization, medical training, engineering design and prototyping, tele-manipulation and tele-presence, and personal entertainment. AR and MR, in contrast to VR, include one or more virtual objects in relation to real objects of the physical world. The experience of virtual objects interacting with real objects greatly enhances the user's enjoyment in using the XR system, and also opens the door for a variety of applications that present realistic and readily understandable information about how the physical world might be altered.

BRIEF SUMMARY

Aspects of the present application relate to methods and apparatus for capturing image information in XR systems with low latency and/or low power consumption. Techniques as described herein may be used together, separately, or in any suitable combination.

Some embodiments relate to an image sensor comprising an imaging array, an input configured to receive signals specifying at least one selected region of the imaging array, and an output at which signals representative of changes in a detected image in the at least one selected region of the imaging array are presented. The image sensor may comprise a plurality of pixel cells comprising the imaging array, at least one comparator operatively coupled to the light-sensitive components of the plurality of pixel cells, and an enable circuitry. Each pixel cell of the plurality of pixel cells may comprise a light-sensitive component. The at least one comparator may comprise an output providing signals indicating a change in sensed light at at least a portion of the light-sensitive components of the plurality of pixel cells. The enable circuitry may be operatively coupled to the input specifying at least one selected region of the imaging array and operatively coupled to the at least one comparator such that the signals indicating a change in sensed light at at least a portion of the light-sensitive components of the plurality of pixel cells are coupled to the output of the image sensor based on the signals indicating a change in sensed light by a light-sensitive component of a pixel cell within the at least one selected region.

In some embodiments, the at least one comparator may comprise a plurality of comparators, each of the plurality of comparators being disposed within a respective one of the plurality of pixel cells.

In some embodiments, the plurality of comparators may comprise enable inputs. The enable circuitry may be configured to provide the signals to the enable inputs so as to selectively enable the respective comparators of the pixel cell of the plurality of pixels cells within the at least one selected region of the imaging array.

In some embodiments, the signals specifying at least one selected region of the imaging array may constitute signals specifying trajectory information. The enable circuitry may comprise a computation engine configured to dynamically identify pixel cells of the plurality of pixel cells within the at least one selected region based on the trajectory information.

In some embodiments, the image sensor may further comprise a motion input configured to receive motion information. The computation engine may be configured to dynamically identify pixel cells of the plurality of pixels cells within the at least one selected region further based on the motion information.

In some embodiments, the imaging array, at least one comparator, and the enable circuitry may be implemented in a single integrated circuit.

In some embodiments, the imaging array may be implemented in a first integrated circuit. The at least one comparator and the enable circuitry may be implemented in a second integrated circuit, configured as a driver for the first integrated circuit.

Some embodiments relate to a method of operating a computing system comprising a sensor worn by a user and a processor configured to process image information, the sensor comprising a plurality of pixel cells generating image information for respective regions in a field of view of the sensor. The method may comprise analyzing one or more images depicting the vicinity of the user; identifying, based on analyzing the images, an object in the vicinity of the user; identifying a patch based at least in part on a portion of the identified object; and selectively providing, from the sensor to the processor, image information from a portion of the plurality of pixel cells based at least in part on correspondence between the patch and the portion of the plurality of pixel cells.

In some embodiments, the portion of the plurality of pixel cells of the sensor may be a first portion of the plurality of pixel cells. The method may further comprise estimating a trajectory for the patch based at least in part on objects represented by the portion of the plurality of pixels of the at least one image; and enabling a plurality of portions of the plurality of pixel cells of the sensor at different timestamps based at least in part on the estimated trajectory of the patch. The plurality of portions of the plurality of pixel cells may comprise the first portion of the plurality of pixel cells.

In some embodiments, obtaining the one or more images may comprise obtaining the one or more images from another sensor and/or a storage memory.

In some embodiments, enabling the portion of the plurality of pixel cells of the sensor may comprise setting a first threshold value for the portion of the plurality of pixel cells and a second threshold for pixel cells outside the portion, the second threshold being greater than the first threshold.

In some embodiments, estimating the trajectory for the patch may comprise predicting one or more motion vectors for the objects or the user; and computing the trajectory for the patch based at least in part on the predicted one or more motion vectors.

In some embodiments, estimating the trajectory for the patch further may comprise dynamically adjusting a size of the patch based at least in part on the estimated trajectory.

In some embodiments, the different timestamps may be determined based at least in part on a shape of the estimated trajectory for the patch.

Some embodiments relate to a computing device comprising a support member, a sensor mechanically coupled to the support member, a processor, and a patch trajectory computing engine coupled to the sensor. The sensor may comprise a plurality of pixel cells generating image information for respective regions in a field of view of the sensor. The processor may be operatively coupled to the sensor and configured to process image information from the sensor. The patch trajectory computing engine may be configured to: dynamically compute a portion of the plurality of pixel cells representing a patch based on information indicating the patch at a first time and information indicating a trajectory of the patch subsequent to the first time; and selectively enable image information from the dynamically computed portion of the plurality of pixel cells to be coupled to the processor at times subsequent to the first time.

In some embodiments, the sensor may comprise a dynamic vision sensor (DVS).

In some embodiments, the sensor may comprise a transmissive diffraction mask (TDM).

In some embodiments, the sensor may be a first sensor. The plurality of pixel cells may be a first plurality of pixel cells. The computing device may further comprise a second sensor coupled to the support member. The second sensor may comprise a second plurality of pixel cells, and configured to output frames at fixed time intervals.

In some embodiments, at least part of the one or more images may be from the second sensor.

In some embodiments, the computing device may further comprise at least one memory. At least part of the one or more images may be from the at least one memory.

The foregoing summary is provided by way of illustration and is not intended to be limiting.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
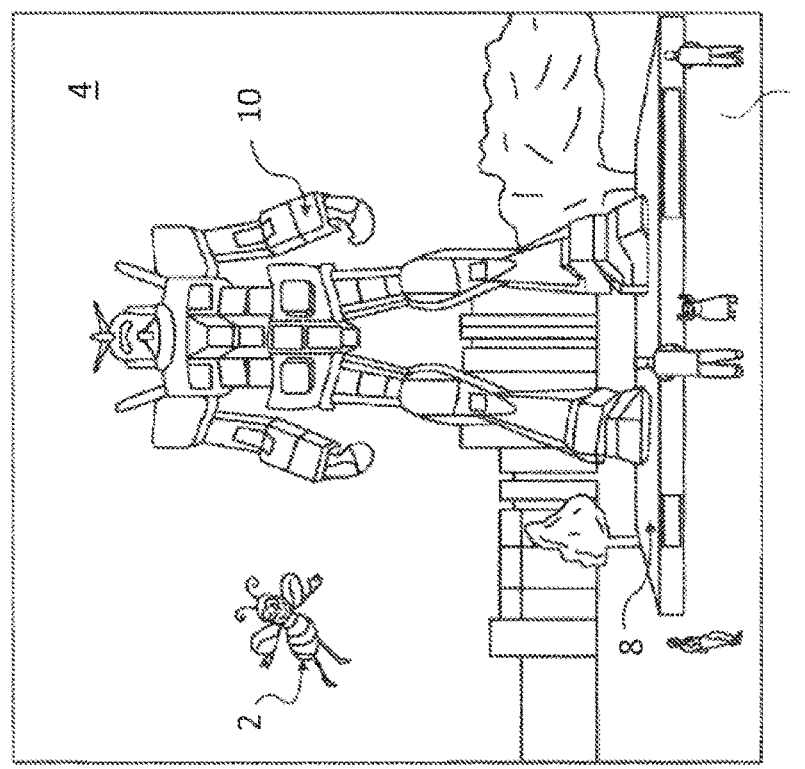
FIG. 1 is a sketch illustrating an example of a simplified augmented reality (AR) scene, according to some embodiments.

Described herein are techniques for operating augmented reality (AR) and mixed reality (MR) systems to acquire image information about physical objects in the physical world with low latency and/or low power consumption.

Information about physical objects is used to realistically present computer-generated virtual objects in the appropriate position and with the appropriate appearance relative to physical objects. The inventors have recognized and appreciated that the need for AR and MR systems to acquire information about objects in the physical world imposes limitations on the size, power consumption and realism of AR and MR systems. As a result of such limitations, the utility and user-enjoyment of those systems is limited.

Known AR and MR systems have sensors worn by a user that obtain information about objects in the physical world around the user, including information about the position of the physical world objects in the field of view of the user. Challenges arise because the objects may move relative to the field of view of the user, either as a result of the objects moving in the physical world or the user changing their pose relative to the physical world such that physical objects come into or leave the field of view of the user or the position of physical objects within the field of view of the user changes. To present realistic AR or MR displays, a model of the physical objects in the physical world must be updated frequently enough to capture these changes, processed with sufficiently low latency, and accurately predicted into the future to cover the full latency path including rendering such that virtual objects displayed based on that information will have the appropriate position and appearance relative to the physical objects as the virtual objects are displayed. Otherwise, virtual objects will appear out of alignment with physical objects, and the combined scene including physical and virtual objects will not appear realistic. For example, virtual objects might look as if they are floating in space, rather than resting on a physical object or may appear to bounce around relative to physical objects. Errors of the visual tracking are especially amplified when the user is moving at a high speed and if there is significant movement in the scene.

Such problems might be avoided by sensors that acquire new data at a high rate. However, the power consumed by such sensors can lead to a need for larger batteries or limit the length of use of such systems. Similarly, processors needed to process data generated at a high rate can drain batteries and add weight to a wearable system, all of which limit the utility or enjoyability of such systems. A known approach, for example, is to operate higher resolution to capture enough visual detail and higher framerate sensors for increased temporal resolution. Alternative solutions might complement the solution with a IR time-of-flight sensor, which might directly indicate position of physical objects relative to the sensor, simple processing, yielding low latency might be performed in using this information to display virtual objects. However, the such sensors consume substantial amounts of power, particularly if they operate in sunlight.

The inventors have recognized and appreciated that AR and MR systems may acquire information about physical objects with low latency and/or reduced power consumption and/or with small components through the use of image sensors that provide for processing image information in a specific region or regions of an image array. The specific regions of the image array may change over time and may be selected based on projected movement of one or more objects with respect to the user's field of view. By outputting information collected in "patches" of the image array, rather than all information that potentially could be captured by the image array, the amount of information provided for processing may be limited, reducing the processing requirements and latency with which position information about physical objects is available.

Such information may be captured with a passive array, such that power consumption and size may be low. In some embodiments, the sensor may be configured to output differential image information, providing information about pixel cells of the image array for which a change is detected. By outputting only differential image information within identified patches, the amount of information for processing may be relatively low, allowing that information to be processed for use in generating AR scenes with low latency in compact and low power processors.

The inventors have recognized and appreciated that AR and MR systems may acquire information about physical objects with low latency and/or reduced power consumption and/or with small components through the use of image sensors incorporating dynamic vision sensing (DVS) techniques in which image information is only provided for pixel cells for which changes are detected. Each change detected by a pixel cell may be output as an "event." By outputting information in events, which may be asynchronous rather than in a constant, periodic rate, motion of objects may be detected faster. In contrast, a conventional image sensor may output image frames. To achieve the same temporal and spatial resolution, a conventional frame-based imager would create significant bandwidth and computing needs containing potentially 8 to 12 megapixels of image information per frame, at a rate of 30 Hz or higher. The image information from conventional image sensors arrives slower and requires more processing to track motion of objects as part of rendering AR or MR scenes at least in part due to the relatively large image size and relatively large quantity of images, which leads to both high latency and high power consumption.

By combining DVS techniques with patch tracking, the inventors have overcome a limitation on conventional DVS systems that enables image sensors combining both to provide substantial advantages in XR systems. In conventional DVS systems, the image sensor, as well as objects being imaged, may be moving, which would lead to a very large number of pixels in the image array changing and therefore a large number of events per second. As a result, DVS techniques have been applied in limited circumstances or in image sensors that have a relatively small number of pixels, such as image sensors with a resolution below 1 megapixel, for example, 128×128, 240×180, and 346×260. The low resolution of conventional DVS sensors leads to limited sensitivity. Images processed in XR systems might, desirably, have high-resolution frames, with potentially millions of pixels. The angular resolution, which may indicate the number of pixels and/or the degree of field-of-view (FOV) of a camera, should be high enough to resolve the physical world to a level that minimizes quantization errors (e.g., vision-based jitter), which would disturb user experience. With such resolution, a sensor used in an XR system might generate about 2 million events per second, which poses high computing burden, consuming substantial power and introducing substantial latency. In some embodiments, the sensor may output differential image information at a frequency no less than 200 Hz, which may translate to a latency of less than 5 ms. In some embodiments, the sensor may output differential image information at a frequency similar to an output rate of an inertial measurement unit (IMU), for example, 1 kHz or higher.

In contrast, an image sensor with patch tracking and DVS techniques in an XR system may output events, for example, at an average rate of 1,000 to 2,000 per second. This amount of image information may be sufficient to track motion of objects and/or the user's own movements over a wide range of conditions so that an AR or MR scene may be quickly updated.

The inventors have recognized and appreciated that in order to effectively use DVS techniques in AR and MR systems, additional information from high resolution images is required from time to time. Such information may be used, for example, to detect objects to track so that a patch location and/or trajectory may be determined. Alternatively or additionally, some moving objects may not be amenable to tracking via DVS techniques. An object, such as a hand, that fills the entire field of view of a camera using an image sensor with DVS, may not trigger sufficient events as it moves because the image does not appear different even as the object moves. The inventors have further recognized and appreciated that the times at which events and full frame images need to be captured in an XR system are largely independent such that a small and low power wearable device for an XR system may be achieved with an image sensor that may be controlled to selectively output events or full image frames.

Figure 2:
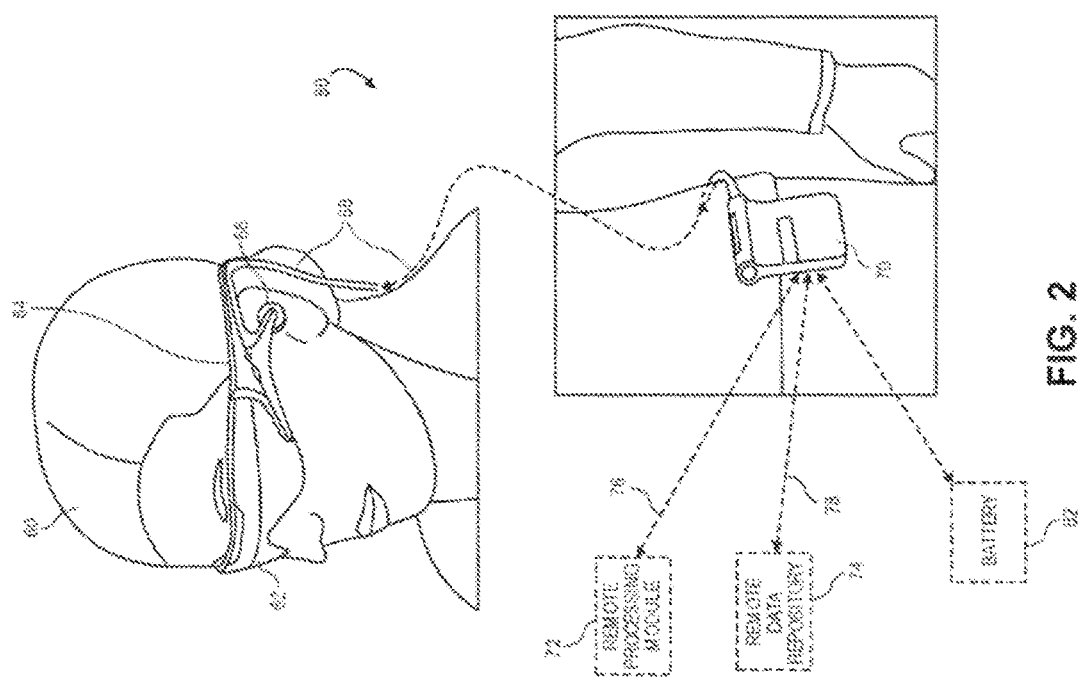
FIG. 2 is a schematic diagram illustrating an example of an AR display system, according to some embodiments.
Figure 3A:
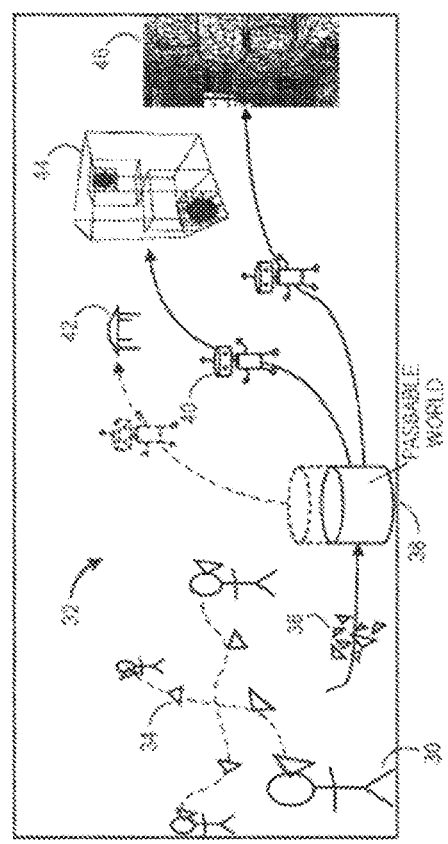
FIG. 3A is a schematic diagram illustrating a user wearing an AR display system rendering AR content as the user moves through a physical world environment, according to some embodiments.
Figure 3B:
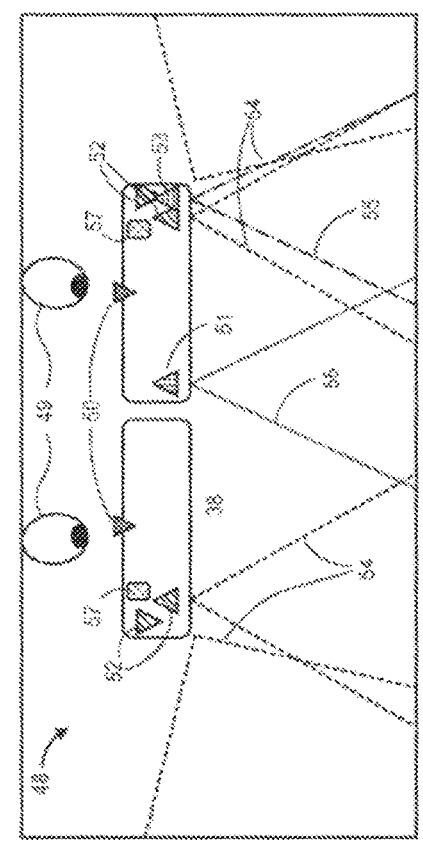
FIG. 3B is a schematic diagram illustrating a viewing optics assembly and attendant components, according to some embodiments.

Techniques as described herein may be used together or separately with many types of devices and for many types of scenes. FIG. 1 illustrates such a scene. FIGS. 2, 3A and 3B illustrate an exemplary AR system, including one or more processors, memory, sensors and user interfaces that may operate according to the techniques described herein.

Referring to Figure (FIG. 1, an AR scene 4 is depicted wherein a user of an AR system sees a physical world park-like setting 6, featuring people, trees, buildings in the background, and a concrete platform 8. In addition to these physical objects, the user of the AR technology also perceives that they "see" virtual objects, here illustrated as a robot statue 10 standing upon the physical world concrete platform 8, and a cartoon-like avatar character 2 flying by which seems to be a personification of a bumble bee, even though these elements (e.g., the avatar character 2, and the robot statue 10) do not exist in the physical world. Due to the extreme complexity of the human visual perception and nervous system, it is challenging to produce an AR system that facilitates a comfortable, natural-feeling, rich presentation of virtual image elements amongst other virtual or physical world imagery elements.

Such a scene may be presented to a user by presenting image information representing the actual environment around the user and overlaying information representing virtual objects that are not in the actual environment. In an AR system, the user may be able to see objects in the physical world, with the AR system providing information that renders virtual objects so that they appear at the appropriate locations and with the appropriate visual characteristics that the virtual objects appear to co-exist with objects in the physical world. In an AR system, for example, a user may look through a transparent screen, such that the user can see objects in the physical world. The AR system may render virtual objects on that screen such that the user sees both the physical world and the virtual objects. In some embodiments, the screen may be worn by a user, like a pair of goggles or glasses.

A scene may be presented to the user via a system that includes multiple components, including a user interface that can stimulate one or more user senses, including sight, sound, and/or touch. In addition, the system may include one or more sensors that may measure parameters of the physical portions of the scene, including position and/or motion of the user within the physical portions of the scene. Further, the system may include one or more computing devices, with associated computer hardware, such as memory. These components may be integrated into a single device or more be distributed across multiple interconnected devices. In some embodiments, some or all of these components may be integrated into a wearable device.

In some embodiments, an AR experience may be provided to a user through a wearable display system. FIG. 2 illustrates an example of wearable display system 80 (hereinafter referred to as "system 80"). The system 80 includes a head mounted display device 62 (hereinafter referred to as "display device 62"), and various mechanical and electronic modules and systems to support the functioning of the display device 62. The display device 62 may be coupled to a frame 64, which is wearable by a display system user or viewer 60 (hereinafter referred to as "user 60") and configured to position the display device 62 in front of the eyes of the user 60. According to various embodiments, the display device 62 may be a sequential display. The display device 62 may be monocular or binocular.

In some embodiments, a speaker 66 is coupled to the frame 64 and positioned proximate an ear canal of the user 60. In some embodiments, another speaker, not shown, is positioned adjacent another ear canal of the user 60 to provide for stereo/shapeable sound control.

System 80 may include local data processing module 70. Local data processing module 70 may be operatively coupled display device 62 through a communication link 68, such as by a wired lead or wireless connectivity. Local data processing module 70 may be mounted in a variety of configurations, such as fixedly attached to the frame 64, fixedly attached to a helmet or hat worn by the user 60, embedded in headphones, or otherwise removably attached to the user 60 (e.g., in a backpack-style configuration, in a belt-coupling style configuration). In some embodiments, local data processing module 70 may not be present, as the components of local data processing module 70 may be integrated in display device 62 or implemented in a remote server or other component to which display device 62 is coupled, such as through wireless communication through a wide area network.

The local data processing module 70 may include a processor, as well as digital memory, such as non-volatile memory (e.g., flash memory), both of which may be utilized to assist in the processing, caching, and storage of data. The data may include data a) captured from sensors (which may be, e.g., operatively coupled to the frame 64) or otherwise attached to the user 60, such as image capture devices (such as cameras), microphones, inertial measurement units, accelerometers, compasses, GPS units, radio devices, and/or gyros; and/or b) acquired and/or processed using remote processing module 72 and/or remote data repository 74, possibly for passage to the display device 62 after such processing or retrieval. The local data processing module 70 may be operatively coupled by communication links 76, 78, such as via a wired or wireless communication links, to the remote processing module 72 and remote data repository 74, respectively, such that these remote modules 72, 74 are operatively coupled to each other and available as resources to the local processing and data module 70.

In some embodiments, the local data processing module 70 may include one or more processors (e.g., a central processing unit and/or one or more graphics processing units (GPU)) configured to analyze and process data and/or image information. In some embodiments, the remote data repository 74 may include a digital data storage facility, which may be available through the Internet or other networking configuration in a "cloud" resource configuration. In some embodiments, all data is stored and all computations are performed in the local data processing module 70, allowing fully autonomous use from a remote module.

In some embodiments, the local data processing module 70 is operatively coupled to a battery 82. In some embodiments, the battery 82 is a removable power source, such as over the counter batteries. In other embodiments, the battery 82 is a lithium-ion battery. In some embodiments, the battery 82 includes both an internal lithium-ion battery chargeable by the user 60 during non-operation times of the system 80 and removable batteries such that the user 60 may operate the system 80 for longer periods of time without having to be tethered to a power source to charge the lithium-ion battery or having to shut the system 80 off to replace batteries.

FIG. 3A illustrates a user 30 wearing an AR display system rendering AR content as the user 30 moves through a physical world environment 32 (hereinafter referred to as "environment 32"). The user 30 positions the AR display system at positions 34, and the AR display system records ambient information of a passable world (e.g., a digital representation of the real objects in the physical world that can be stored and updated with changes to the real objects in the physical world) relative to the positions 34. Each of the positions 34 may further be associated with a "pose" in relation to the environment 32 and/or mapped features or directional audio inputs. A user wearing the AR display system on their head may be looking in a particular direction and tilt their head, creating a head pose of the system with respect to the environment. At each position and/or pose within the same position, sensors on the AR display system may capture different information about the environment 32. Accordingly, information collected at the positions 34 may be aggregated to data inputs 36 and processed at least by a passable world module 38, which may be implemented, for example, by processing on a remote processing module 72 of FIG. 2.

The passable world module 38 determines where and how AR content 40 can be placed in relation to the physical world as determined at least in part from the data inputs 36. The AR content is "placed" in the physical world by presenting the AR content in such a way that the user can see both the AR content and the physical world. Such an interface, for example, may be created with glasses that user can see through, viewing the physical world, and that can be controlled so that virtual objects appear in controlled locations within the user's field of view. The AR content is rendered as if it were interacting with objects in the physical world. The user interface is such that the user's view of objects in the physical world can be obscured to create the appearance that AR content is, when appropriate, obscuring the user's view of those objects. For example, AR content may be placed by appropriately selecting portions of an element 42 in environment 32 (e.g., a table) to display and displaying AR content 40 shaped and positioned as if it were resting on or otherwise interacting with that element 42. AR content may also be placed within structures not yet within a field of view 44 or relative to mapped mesh model 46 of the physical world.

As depicted, element 42 is an example of what could be multiple elements within the physical world that may be treated as if it is fixed and stored in passable world module 38. Once stored in the passable world module 38, information about those fixed elements may be used to present information to the user so that the user 30 can perceive content on the fixed element 42 without the system having to map to the fixed element 42 each time the user 30 sees it. The fixed element 42 may, therefore, be a mapped mesh model from a previous modeling session or determined from a separate user but nonetheless stored on the passable world module 38 for future reference by a plurality of users. Therefore, the passable world module 38 may recognize the environment 32 from a previously mapped environment and display AR content without a device of the user 30 mapping the environment 32 first, saving computation process and cycles and avoiding latency of any rendered AR content.

Similarly, the mapped mesh model 46 of the physical world can be created by the AR display system, and appropriate surfaces and metrics for interacting and displaying the AR content 40 can be mapped and stored in the passable world module 38 for future retrieval by the user 30 or other users without the need to re-map or model. In some embodiments, the data inputs 36 are inputs such as geolocation, user identification, and current activity to indicate to the passable world module 38 which fixed element 42 of one or more fixed elements are available, which AR content 40 has last been placed on the fixed element 42, and whether to display that same content (such AR content being "persistent" content regardless of user viewing a particular passable world model).

Even in embodiments in which objects are considered to be fixed, the passable world module 38 may be updated from time to time to account for the possibility of changes in the physical world. The model of fixed objects may be updated with a very low frequency. Other objects in the physical world may be moving or otherwise not regarded as fixed. To render an AR scene with a realistic feel, the AR system may update the position of these non-fixed objects with a much higher frequency than is used to update fixed objects. To enable accurate tracking of all of the objects in the physical world, an AR system may draw information from multiple sensors, including one or more image sensors.

FIG. 3B is a schematic illustration of a viewing optics assembly 48 and attendant components. Oriented to user eyes 49, in some embodiments, two eye tracking cameras 50 detect metrics of the user eyes 49 such as eye shape, eyelid occlusion, pupil direction and glint on the user eyes 49. In some embodiments, one of the sensors may be a depth sensor 51, such as a time of flight sensor, emitting signals to the world and detecting reflections of those signals from nearby objects to determine distance to given objects. A depth sensor, for example, may quickly determine whether objects have entered the field of view of the user, either as a result of motion of those objects or a change of pose of the user. However, information about the position of objects in the field of view of the user may alternatively or additionally be collected with other sensors. In some embodiments, world cameras 52 record a greater-than-peripheral view to map the environment 32 and detect inputs that may affect AR content. In some embodiments, the world camera 52 and/or camera 53 may be grayscale and/or color image sensors, which may output grayscale and/or color image frames at fixed time intervals. Camera 53 may further capture physical world images within a field of view of the user at a specific time. Pixels of a frame-based image sensor may be sampled repetitively even if their values are unchanged. Each of the world cameras 52, the camera 53 and the depth sensor 51 have respective fields of view of 54, 55, and 56 to collect data from and record a physical world scene, such as the physical world environment 32 depicted in FIG. 3A.

Inertial measurement units 57 may determine movement and/or orientation of the viewing optics assembly 48. In some embodiments, each component is operatively coupled to at least one other component. For example, the depth sensor 51 may be operatively coupled to the eye tracking cameras 50 to confirm actual distance of a point and/or region in the physical world that the user's eyes 49 are looking at.

It should be appreciated that a viewing optics assembly 48 may include some of the components illustrated in FIG. 3B. For example, a viewing optics assembly 48 may include a different number of components. In some embodiments, for example, a viewing optics assembly 48 may include two world camera 52 instead of four. Alternatively or additionally, cameras 52 and 53 need not capture a visible light image of their full field of view. A viewing optics assembly 48 may include other types of components. In some embodiments, a viewing optics assembly 48 may include one or more dynamic vision sensor (DVS), whose pixels may respond asynchronously to relative changes in light intensity exceeding a threshold.

In some embodiments, a viewing optics assembly 48 may not include the depth sensor 51 based on time of flight information. In some embodiments, for example, a viewing optics assembly 48 may include one or more plenoptic camera, whose pixels may capture not only light intensity but also an angle of incoming light. For example, a plenoptic camera may include an image sensor overlaid with a transmissive diffraction mask (TDM). Alternatively or additionally, a plenoptic camera may include an image sensor containing angle-sensitive pixels and/or phase-detection auto-focus pixels (PDAF) and/or micro-lens array (MLA). Such a sensor may serve as a source of depth information instead of or in addition to depth sensor 51.

It also should be appreciated that the configuration of the components in FIG. 3B is illustrated as an example. A viewing optics assembly 48 may include components with any suitable configuration such that a user can have the largest field of view for a particular set of components. For example, if a viewing optics assembly 48 has one world camera 52, the world camera may be placed in a center region of the viewing optics assembly instead of on the sides.

Information from these sensors in viewing optics assembly 48 may be coupled to one or more of the processors in the system. The processors may generate data that may be rendered so as to cause the user to perceive virtual content interacting with objects in the physical world. That rendering may be implemented in any suitable way, including generating image data that depicts both physical and virtual objects. In other embodiments, physical and virtual content may be depicted in one scene by modulating the opacity of a display device that a user looks through at the physical world. The opacity may be controlled so as to create the appearance of the virtual object and also to block the user from seeing objects in the physical world that are occluded by the virtual objects. In some embodiments, the image data may only include virtual content that may be modified to realistically interact with the physical world (e.g. clip content to account for occlusions), which may be viewed through the user interface. Regardless of how content is presented to a user, a model of the physical world may be used so that characteristics of the virtual objects, which can be impacted by physical objects, including the shape, position, motion and visibility of the virtual object, can be correctly computed.

The model of the physical world may be created from data collected from sensors on a wearable device of the user. In some embodiments, the model may be created from data collected by multiple users, which may be aggregated in a computing device remote from all of the users (and which may be "in the cloud").

In some embodiments, at least one of the sensors may be configured to acquire information about physical objects, particularly non-fixed objects, in a scene at a high frequency with low latency using compact and low power components. That sensor may employ patch tracking to limit the amount of data output.

Figure 4:
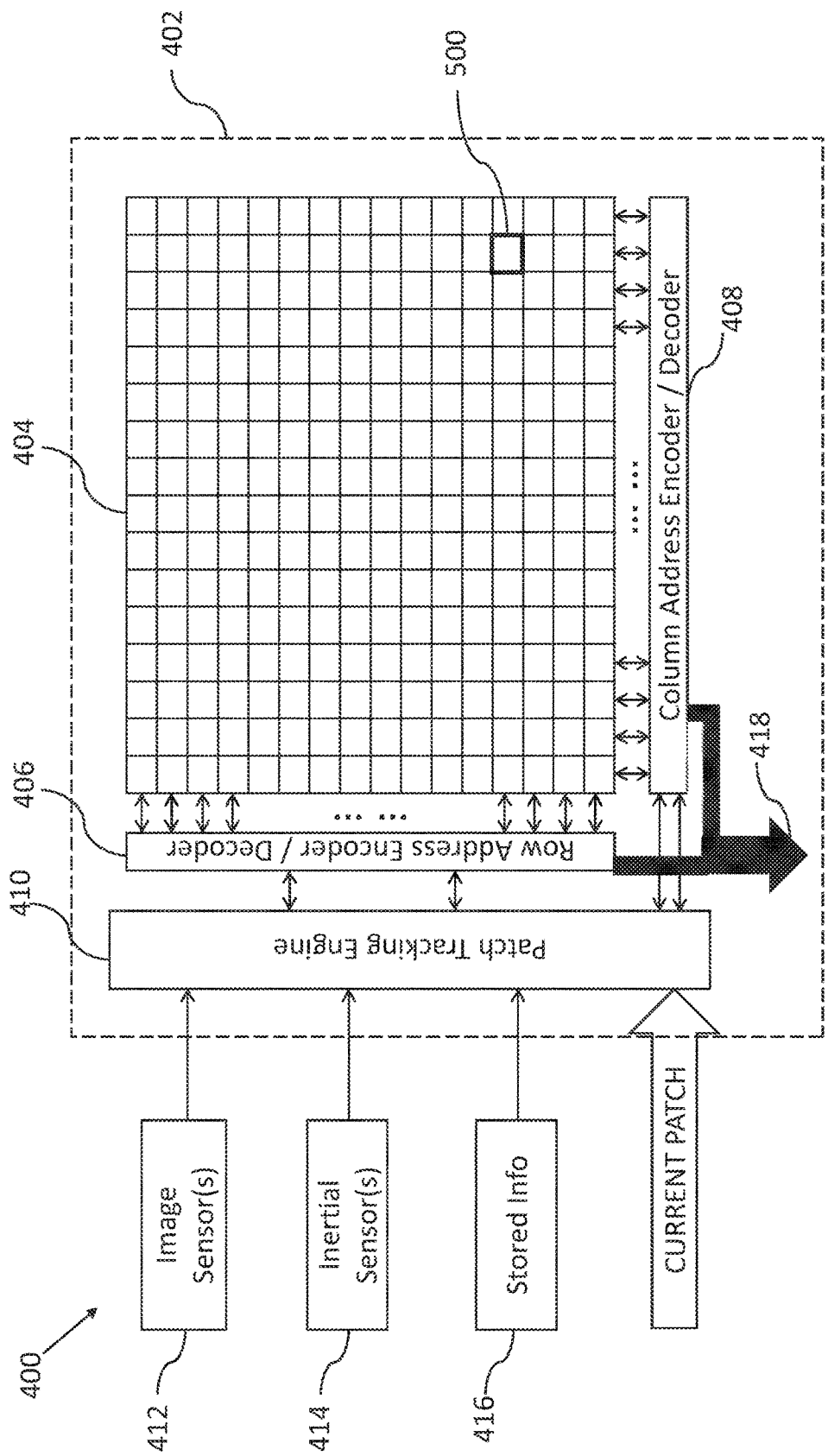
FIG. 4 is a schematic diagram illustrating an image sensing system, according to some embodiments.

FIG. 4 depicts an image sensing system 400, according to some embodiments. The image sensing system 400 may include an image sensor 402, which may include an image array 404, which may contain multiple pixels, each responsive to light, as in a conventional image sensor. Sensor 402 further may include circuitry to access each pixel. Accessing a pixel may entail obtaining information about incident light generated by that pixel. Alternatively or additionally, accessing a pixel may entail controlling that pixel, such as by configuring it to provide an output only upon detection of some event.

In the illustrated embodiment, image array 404 is configured as an array with multiple rows and columns of pixels. In such an embodiment, the access circuitry may be implemented as row address encoder/decoder 406 and column address encoder/decoder 408. Image sensor 402 may further contain circuitry that generates inputs to the access circuitry to control the timing and order in which information is read out of pixels in image array 404. In the illustrated embodiment, that circuitry is patch tracking engine 410. In contrast to a conventional image sensor that may output image information captured by pixels in each row successively, image sensor 402 may be controlled to output image information in specified patches. Further, the locations of those patches with respect to the image array may change over time. In the embodiment illustrated, patch tracking engine 410 may output image array access information to control the output of image information from portions of the image array 404 corresponding to the location of patches, and the access information may change dynamically, based on estimates of the motion of objects in an environment and/or motion of the image sensor relative to those objects.

In some embodiments, the image sensor 402 may have the function of a dynamic vision sensor (DVS) such that the image information is provided by the sensor only when there is a change in an image property (e.g., intensity) for a pixel. For example, the image sensor 402 may apply one or more thresholds that define ON and OFF states of a pixel. The image sensor may detect that a pixel changed state and selectively provide outputs for only those pixels, or only those pixels in a patch, that changed state. These outputs may be made asynchronously as they are detected, rather than as part of a readout of all pixels in the array. The output, for example, may be in the form of address-event representation (AER) 418, which may include pixel addresses (e.g., row and column) and the types of event (ON or OFF). An ON event may indicate a pixel cell at a respective pixel address senses an increase in light intensity; and an OFF event may indicate a pixel cell at a respective pixel address senses a decrease in light intensity. The increase or decrease may be relative to an absolute level or may be a change relative to a level at the last output from the pixel. That change may be expressed as a fixed offset or as a percentage of the value at the last output from the pixel, for example.

Use of DVS techniques in connection with patch tracking may enable an image sensor suitable for use in XR systems. When combined in an image sensor, the amount of generated data may be limited to data from pixel cells that are within a patch and that detect a change that would trigger output of an event.

In some scenarios, high resolution image information is desirable. However, a large sensor, with over one million pixel cells, to generate high resolution image information might generate large amounts of image information when DVS techniques are used. The inventors have recognized and appreciated that a DVS sensor might produce a large number of events reflecting movement in the background or changes in an image other than as a result of motion of an object being tracked. Currently, resolutions of DVS sensors are limited to below 1 megapixel, for example, 128×128, 240×180, and 346×260 so as to limit the number of events generated. Such sensors sacrifice resolution for tracking objects, and might not, for example, detect fine finger movements of a hand. Moreover, if the image sensor outputs image information in other formats, limiting the resolution of sensor array to output a manageable number of events may also limit use of the image sensor for generating high-resolution image frames together with the DVS function. Sensors as described herein may have a resolution higher than VGA, including up to 8 megapixels or 12 megapixels, in some embodiments. Nonetheless, patch tracking as described herein may be used to limit the number of events output by the image sensor per second. As a result, image sensors that operate in at least two modes may be enabled. For example an image sensor with megapixel resolution may operate in a first mode in which it outputs events in specific patches being tracked. In a second mode, it may output high resolution image frames or portions of image frames. Such an image sensor may be controlled in an XR system to operate in these different modes based on the function of the system.

The image array 404 may include a plurality of pixel cells 500 arranged in an array. FIG. 5A depicts an example of the pixel cell 500, which in this embodiment is configured for use in an imaging array that implements DVS techniques. Pixel cell 500 may include a photoreceptor circuit 502, a differencing circuit 506, and a comparator 508. The photoreceptor circuit 502 may include a photodiode 504 that converts light striking the photodiode into a measurable electrical signal. In this example, the conversion is to an electrical current I. Transconductance amplifier 510 converts the photo current I into a voltage. That conversion may be linear or non-linear, such as according to a function of log I. Regardless of the specific transfer function, the output of transconductance amplifier 510 indicates the amount of light detected at photodiode 504. Although a photodiode is illustrated as an example, it should be appreciated that other light-sensitive components that produce a measurable output in response to incident light may be implemented in the photoreceptor circuit in place of or in addition of the photodiode.

In the embodiment of FIG. 5A, circuitry to determine whether the output of the pixel has changed sufficiently to trigger an output for that pixel cell is incorporated into the pixel itself. In this example, that function is implemented by differencing circuit 506 and comparator 508. The differencing circuit 506 may be configured to reduce DC mismatch between pixel cells by, for example, balancing the output of the differencing circuit to a reset level after the generation of an event. In this example, differencing circuit 506 is configured to produce an output showing a change in the output of photodiode 504 since the last output. The differencing circuit may include an amplifier 512 having a gain −A, a capacitor 514, which may be implemented as a single circuit element or one or more capacitors connected in a network, and a reset switch 516.

In operation, the pixel cell will be reset by momentarily closing switch 516. Such a reset may occur at the beginning of operation of the circuit as well as at any time thereafter that an event is detected. When the pixel 500 is reset, the voltage across capacitor 514 is such that, when subtracted from the output of transconductance amplifier 510, a zero voltage at the input of amplifier 512 results. When switch 516 opens, the output of transconductance amplifier 510 will be such that, in combination with the voltage drop across capacitor 514, there is a zero voltage at the input of amplifier 512. The output of transconductance amplifier 510 changes as a result of a change in the amount of light striking photodiode 504. When the output of transconductance amplifier 510 increases or decreases, the output of amplifier 512 will swing positive or negative, by the change amount, amplified by the gain of amplifier 512.

The comparator 508 may determine whether an event is generated and the sign of the event by, for example, comparing the output voltage V of the differencing circuit to a predetermined threshold voltage C. In some embodiments, the comparator 508 may include two comparators comprising transistors, one pair may operate when the output of amplifier 512 shows a positive change, and may detect increasing changes (ON events); the other comparator may operate when the output of amplifier 512 shows a negative change, and may detecting decreasing changes (OFF events). It should be appreciated, however, that amplifier 512 may have a negative gain. In such an embodiment, an increase in the output of transconductance amplifier 510 may be detected as a negative voltage change at the output of amplifier 512. Similarly, it should be appreciated that positive and negative voltages may be relative to earth ground or any suitable reference level. Regardless, the value of the threshold voltage C may be controlled by characteristics of the transistors (e.g., transistor sizes, transistor threshold voltages) and/or by values of the reference voltages that may be applied to the comparator 508.

Figure 5B:
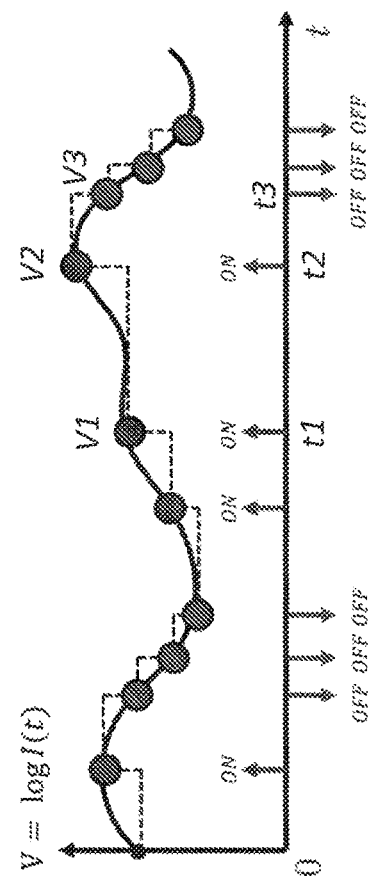
FIG. 5B is a schematic diagram illustrating an output events of the pixel cell of FIG. 5A, according to some embodiments.
Figure 5A:
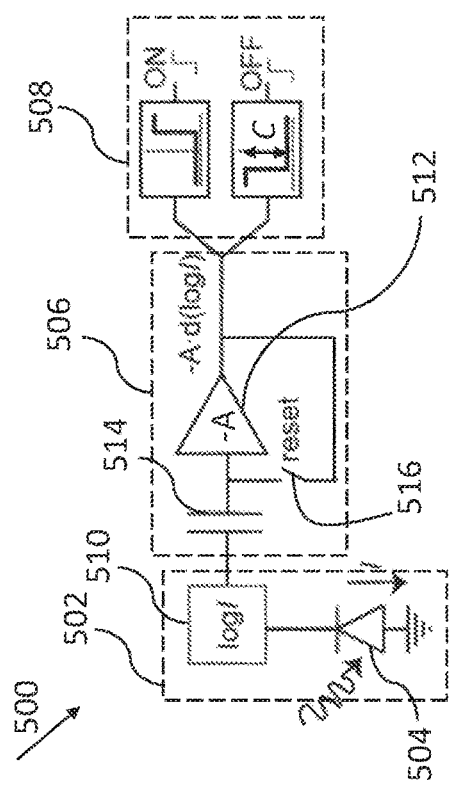
FIG. 5A is a schematic diagram illustrating a pixel cell in FIG. 4, according to some embodiments.

FIG. 5B depicts an example of event outputs (ON, OFF) of the pixel cell 500 over time t. In the illustrated example, at time t1, the output of the differencing circuit has a value of V1; at time t2, the output of the differencing circuit has a value of V2; and at time t3, the output of the differencing circuit has a value of V3. Between time t1 and time t2, although the photodiode senses some increases in light intensity, the pixel cell outputs no events because the changes of V does not exceed the value of the threshold voltage C. At time t2, the pixel cell outputs an ON event because V2 is larger than V1 by the value of the threshold voltage C. Between time t2 and time t3, although the photodiode senses some decreases in light intensity, the pixel cell outputs no events because the changes of V does not exceed the value of the threshold voltage C. At time t3, the pixel cell outputs an OFF event because V3 is less than V2 by the value of the threshold voltage C.

Each event may trigger an output at AER 418. The output may include, for example, an indication of whether the event is an ON or OFF event and an identification of the pixel, such as its row and column. Other information may alternatively or additionally be included with the output. For example, a time stamp might be included, which might be useful if events are queued for later transmission or processing. As another example, the current level at the output of amplifier 510 might be included. Such information might be optionally included, for example, if further processing, in addition to detecting motion of objects, is to be performed.

It should be appreciated that the frequency of the event outputs and thus the sensitivity of the pixel cell may be controlled by the value of the threshold voltage C. For example, the frequency of the event outputs may be reduced by increasing the value of the threshold voltage C, or increased by reducing the threshold voltage C. It should also be appreciated that the threshold voltage C may be different for an ON event and an OFF event by, for example, setting different reference voltages for the comparator for detecting an ON event and the comparator for detecting an OFF event. It should also be appreciated that a pixel cell may also output a value indicating the size of light intensity changes in place of or in addition to the sign signals that indicates the detection of events.

The pixel cell 500 of FIGS. 5A and 5B is illustrated as an example according to some embodiments. Other designs may also be suitable for a pixel cell. In some embodiments, a pixel cell may include the photoreceptor circuit and differencing circuit but share a comparator circuit with one or more other pixel cells. In some embodiments, a pixel cell may include circuitry configured to calculate values of changes, for example, an active pixel sensor at the pixel level.

Regardless of the manner in which events are detected for each pixel cell, the ability to configure pixels to output only upon detection of an event may be used to limit the amount of information required to maintain a model of the positions of non-fixed (i.e. movable) objects. For example, pixels within a patch may be set with a threshold voltage C triggered when a relatively small change occurs. Other pixels, outside of a patch, may have a larger threshold, such as three or five times. In some embodiments, the threshold voltage C for pixels outside of any patch may be set so large that the pixel is effectively disabled and does not produce any output, regardless of the amount of change. In other embodiments, pixels outside a patch may be disabled in other ways. In such an embodiment, the threshold voltage may be fixed for all pixels, but pixels may be selectively enabled or disabled based on whether they are within a patch.

In yet other embodiments, the threshold voltage for one or more pixels may be set adaptively as a way to modulate the amount of data output from an image array. For example, an AR system may have processing capacity to process a number of events per second. The threshold for some or all pixels may be increased when the number of events per second being output exceeds an upper limit. Alternatively or additionally, the threshold might be lowered when the number of events per second dropped below a lower limit, enabling more data for more accurate processing. The number of events per second, as a specific example, may be between 200 and 2,000 events. Such a number of events constitutes a substantial reduction in the number of pieces of data to be processed per second compared, for example, to processing all of the pixel values scanned out from an image sensor, which would constitute 30 million or more pixel values per second. That number of events is even a reduction in comparison to processing just the pixels within a patch, which may be lower, but nonetheless may be multiple tens of thousands of pixel values or more per second.

The control signals to enable and/or set threshold voltages for each of multiple pixels may be generated in any suitable way. However, in the illustrated embodiment, those control signals are set by patch tracking engine 410 or based on processing within processing module 72 or other processor.

Referring back to FIG. 4, the image sensing system 400 may receive inputs from any suitable components such that the patch tracking engine 410 may dynamically select at least one region of the image array 404 to be enabled and/or disabled based at least on the received inputs so as to implement the patch. Patch tracking engine 410 may be digital processing circuitry that has memory, storing one or more parameters of a patch. The parameters may be, for example, the boundaries of the patch, and may include other information, such as information about scale factors between motion of the image array and motion within the image array of an image of a movable object associated with the patch. Patch tracking engine 410 may also include circuitry configured to perform calculations on the stored values and other measured values supplied as inputs.

In the illustrated embodiment, patch tracking engine 410 receives as an input a designation of a current patch. The patch may be designated based on its size and position within image array 404, such as by specifying a range of row and column addresses of the patch. Such a specification may be provided as an output of processing module 72 (FIG. 2) or other components processing information about the physical world. Processing module 72, for example, may designate a patch to encompass the current location of each movable object within the physical world or a subset of movable objects that are being tracked in order to render a virtual object with appropriate appearance with respect to the physical world. For example, if an AR scene is to include as a virtual object a toy doll balanced on a physical object such as a moving toy car, a patch may be designated encompassing that toy car. A patch might not be designated for another toy car, moving in the background, as there may be less need to have up-to-date information about that object in order to render a realistic AR scene.

Regardless of how the patch is selected, information about the current position of the patch may be supplied to patch tracking engine 410. In some embodiments, patches may be rectangular, such that the location of the patch may be simply specified as a beginning and ending row and column. In other embodiments, patches may have other shapes, such as circular and the patch may be specified in other ways, such as by a center point and a radius.

In some embodiments, trajectory information may also be supplied about the patch. The trajectory, for example, may specify motion of the patch with respect to coordinates of image array 404. Processing module 72, for example, may construct a model of the motion of the movable object within the physical world and/or the motion of the image array 404 with respect to the physical world. As motion of either or both may affect the location within image array 404 where an image of an object is projected, the trajectory of a patch within the image array 404 may be computed based on either or both. The trajectory may be specified in any suitable way, such as the parameters of a linear, quadratic, cubic or other polynomial equation.

In other embodiments, patch tracking engine 410 may dynamically compute the location of a patch based on inputs from sensors providing information about the physical world. Information from the sensors may be supplied directly from the sensors. Alternatively or additionally, the sensor information may be processed to extract information about the physical world before being supplied to patch tracking engine 410. Extracted information, for example, may include motion of image array 404 with respect to the physical world, distance between image array 404 and an object whose image falls within a patch or other information that may be used to dynamically align a patch in the image array 404 with an image of an object in the physical world as image array 404 and/or the object moves.

Examples of the input components may include image sensors 412 and inertial sensors 414. Examples of the image sensors 412 may include the eye tracking cameras 50, depth sensor 51, world cameras 52 and/or camera 52. Examples of the inertial sensors 414 may include inertial measurement units 57. In some embodiments, input components may be selected to provide data at a relatively high rate. Inertial measurement units 57, for example, may have an output rate between 200 and 2,000 measurements per second, such as between 800 and 1,200 measurements per second. The patch position may be updated at a similarly high rate. By using inertial measurement units 57 as a source of input to patch tracking engine 410, the location of a patch may be updated 800 to 1,200 times per second, as one specific example. In this way, a movable object may be tracked with high accuracy, using a relatively small patch that limits the number of events that need to be processed. Such an approach may lead to very low latency between a change of relative position of the image sensor and a movable object, with similarly low latency of updates to the rendering of virtual objects so as to provide a desirable user experience.

In some scenarios, a movable object being tracked with a patch may be a stationary object within the physical world. The AR system, for example, may identify stationary objects from analyzing multiple images taken of the physical world and select features of one or more of the stationary objects as reference points for determining motion of a wearable device having image sensors on it. Frequent and low latency updates of the locations of these reference points relative to a sensor array may be used to provide frequent and low latency computations of head pose of a user of the wearable device. As head pose may be used to realistically render virtual objects via a user interface on the wearable, frequent and low latency updates of head pose improves the user experience of the AR system. Thus, having inputs to patch tracking engine 410 that control the position of a patch come only from sensors with a high output rate, such as one or more inertial measurement units, may lead to a desirable user experience of the AR system.

However, in some embodiments, other information may be supplied to patch tracking engine 410 to enable it to compute and/or apply a trajectory to a patch. This other information may include stored information 416, such as the passable world module 38 and/or mapped mesh model 46. This information may indicate one or more prior positions of an object relative to the physical world such that consideration of changes of these prior positions and/or changes in the current position relative to the prior positions may indicate a trajectory of an object in the physical world, which might then be mapped to a trajectory of a patch across image array 404. Other information in a model of a physical world may alternatively or additionally be used. For example, the size of a movable object and or distance or other information on position relative to image array 404 may be used to compute either a location or trajectory of a patch across image array 404 associated with that object.

Regardless of the manner in which the trajectory is determined, patch tracking engine 410 may apply that trajectory to compute an updated location of the patch within the image array 404 at a high rate, such as faster than once per second or more than 800 times per. The rate may be limited by processing capability, so as to be less than 2,000 times per second, in some embodiments It should be appreciated that the processing to track changes in a movable object may be less than to reconstruct the full physical world. However, there may be a reconstruction of the physical world at intervals longer than the intervals between updates in the positions of movable objects, such as every 30 seconds or every 5 seconds. The location of objects to track, and the location of a patch that will capture information about those objects may be recalculated when there is a reconstruction of the physical world.

FIG. 4 illustrates an embodiment in which the processing circuitry to both dynamically generate a patch and control the selective outputting of image information from within that patch is configured to control image array 404 directly so that image information output from the array is limited to the selected information. Such circuitry, for example, may be integrated into the same semiconductor chip that houses the image array 404 or may be integrated to a separate controller chip for image array 404. However, it should be appreciated that the circuitry generating the control signals for image array 404 may be distributed throughout an AR system. For example, some or all of the functions may be performed by programming in processing module 72 or other processor within the system.

The image sensing system 400 may output image information, for each of a plurality of pixels. Each pixel of the image information may correspond to one of the pixel cells of the image array 404. The output image information from the image sensing system 400 may be image information for each of one or more patches corresponding to the at least one region of the image array 404, selected by the patch tracking engine 410. In some embodiments, such as when each pixel of the image array 404 has a differential configuration than as illustrated in FIG. 5A, the pixels in the output image information may identify pixels for which a change of light intensity was detected by the image sensor 400 within one or more patches.

In some embodiments, the output image information from the image sensing system 400 may be image information for pixels outside each of one or more patches corresponding to the at least one region of the image array, selected by the patch tracking engine 410. For example, a deer may be running in a physical world with a running river. Details of river waves may not be of interest, but may trigger pixel cells of the image array 402. The patch tracking engine 410 may create a patch enclosing the river, and disable a portion of the image array 402 corresponding to the patch enclosing the river.

Based on the identification of changed pixels, further processing may be performed. For example, portions of a world model corresponding to portions of the physical world being imaged by the changed pixels may be updated. These updates may be performed based on information collected with other sensors. In some embodiments, further processing may be conditioned on or triggered by multiple changed pixels in a patch. For example, updates may be performed once 10%, or some other threshold amount of pixels, in a patch detect a change.

In some embodiments, image information in other formats may be output from an image sensor, and may be used in combination with change information to make updates to a world model. In some embodiments, the format of the image information output from the image sensor may change from time to time during operation of a VR system. In some embodiments, for example, pixel cells 500 may be operated to produce at some times differential outputs, such as are produced in comparators 508. The output of amplifier 510 may be switchable to output at other times the magnitude of light incident on photodiode 504. For example, the output of amplifier 510 may be switchably connected to a sense line that is, in turn connected to an A/D converter that can provide a digital indication of the magnitude of the incident light based on the magnitude of the output of amplifier 510.

An image sensor in this configuration may be operated as part of an AR system to output differentially most of the time, outputting an event only for pixels for which a change above a threshold is detected or outputting an event only for pixels within a patch for which a change above a threshold is detected. Periodically, such as every 5 to 30 seconds, a full image frame, with magnitude information for all pixels in the image array may be output. Low latency and accurate processing may be achieved in this way, with the differential information being used to quickly update selected portions of a world model for which changes most likely to affect user perception occurred whereas the full image may be used to more update larger portions of the world model. Though the full updates to the world model occur only at the slower rate, any delay in updating the model may not meaningfully impact the user's perception of the AR scene.

The output mode of the image sensor may be changed from time to time throughout the operation of the image sensor such that the sensor outputs one or more of intensity information for some or all of the pixels and an indication of a change for some or all of the pixels in the array.

Figure 6:
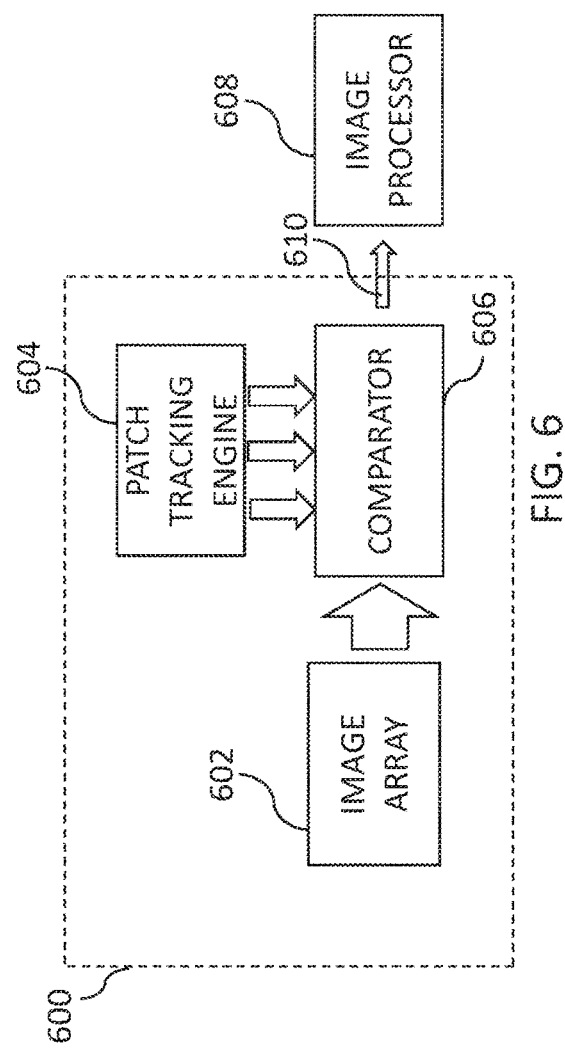
FIG. 6 is a schematic diagram illustrating an image sensor, according to some embodiments.

It is not a requirement that image information from patches be selectively output from an image sensor by limiting the information output from the image array. In some embodiments, image information may be output by all pixels in the image array and only information about specific regions of the array may be output from the image sensor. FIG. 6 depicts an image sensor 600, according to some embodiments. The image sensor 600 may include an image array 602. In this embodiment, image array 602 may be similar to a conventional image array that scans out rows and columns of pixel values. Operation of such an image array may be adapted by other components. The image sensor 600 may further include patch tracking engine 604, and/or comparator 606. Image sensor 600 may provide an output 610 to an image processor 608. Processor 608, for example, may be a portion of processing module 72 (FIG. 2).

Patch tracking engine 604 may have a structure and function similar to patch tracking engine 410. It may be configured to receive signals specifying at least one selected region of the image array 602 and then generate control signals specifying a dynamic location of that region based on a computed trajectory within image array 602 of an image of an object represented by that region. In some embodiments, the patch tracking engine 604 may receive signals specifying at least one selected region of the image array 602, which may include trajectory information for the region or regions. The patch tracking engine 604 may be configured to perform computations that dynamically identify pixel cells within the at least one selected region based on the trajectory information. Variations in the implementation of patch tracking engine 604 are possible. For example, the patch tracking engine may update the location of the patch based on sensors indicating motion of the image array 602 and/or projected motion of an object associated with the patch.

In the embodiment illustrated in FIG. 6, image sensor 600 is configured to output differential information for pixels within identified patches. Comparator 606 may be configured to receive control signals from patch tracking engine 604 that identify pixels within the patch. Comparator 606 may selectively operate on pixels being output from image array 602 that have addresses within the patch as indicated by patch tracking engine 604. Comparator 606 may operate on the pixel cells so as to generate signals indicating a change in sensed light detected by the at least one region of the image array 602. As one example of an implementation, comparator 606 may contain memory elements storing reset values of pixel cells within the array. As current values of those pixels are scanned out of image array 602, circuitry within comparator 606 may compare the stored value to the current value and output an indication when the difference exceeds a threshold. Digital circuitry, for example, may be used to store values and make such a comparison. In this example, the output of image sensor 600 may be processed like the output of image sensor 400.

In some embodiments, the image array 602, patching tracking engine 604, and the comparator 606 may be implemented in a single integrated circuit, such as a CMOS integrated circuit. In some embodiments, the image array 602 may be implemented in a single integrated circuit. The patch tracking engine 604 and comparator 606 may be implemented in a second single integrated circuit, configured as, for example, a driver for the image array 602. Alternatively or additionally, some or all of the functions of patch tracking engine and/or comparator 606 may be distributed to other digital processors within the AR system.

Figure 7:
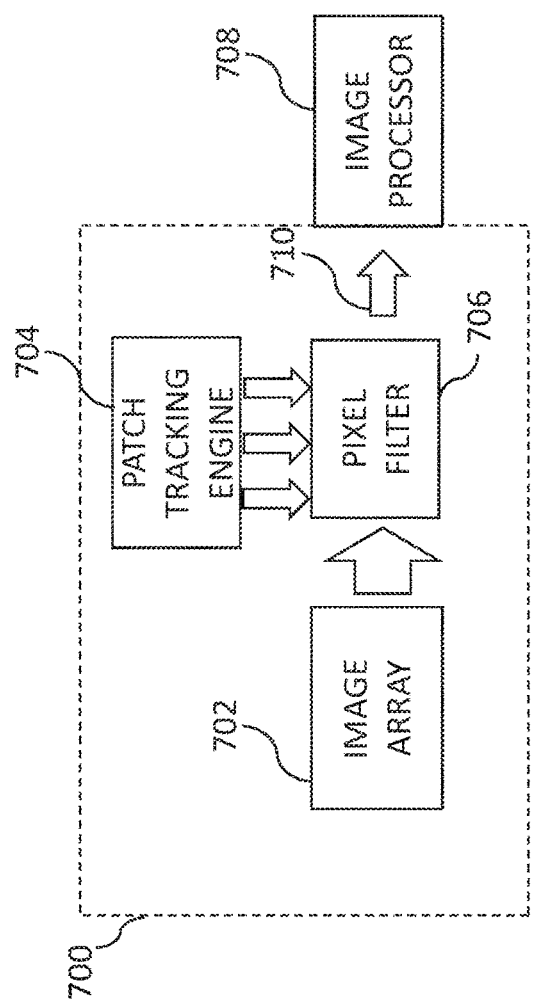
FIG. 7 is a schematic diagram illustrating an image sensor, according to some embodiments.

Other configurations or processing circuitry are also possible. FIG. 7 depicts an image sensor 700, according to some embodiments. The image sensor 700 may include an image array 702. In this embodiment, image array 702 may have pixel cells with a differential configuration, such as is shown for pixel 500 in FIG. 5A. However, the embodiments herein are not limited to differential pixel cells as patch tracking may be implemented with image sensors that output intensity information.

In the illustrated embodiment of FIG. 7, patch tracking engine 704 produces control signals indicating addresses of the pixel cells within one or more patches being tracked. Patch tracking engine 704 may be constructed and operate like patch tracking engine 604. Here, patch tracking engine 704 provides control signals to pixel filter 706, which passes to output 710 image information from only those pixels within a patch. As shown, output 710 is coupled to an image processor 708, which may further process the image information for pixels within a patch using techniques as described herein or in other suitable ways.

Figure 8:
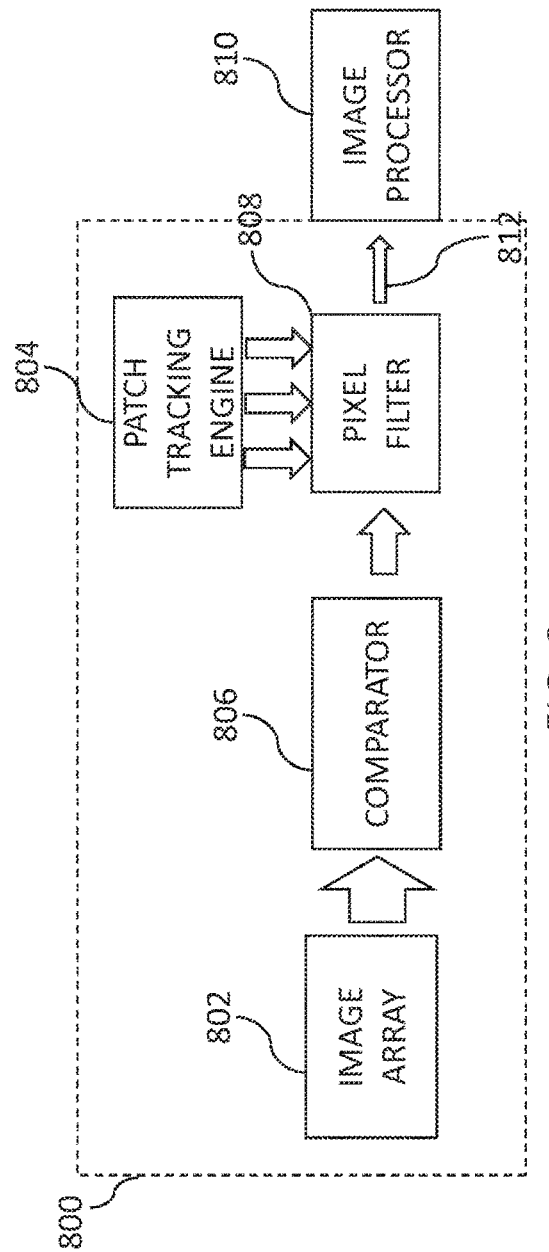
FIG. 8 is a schematic diagram illustrating an image sensor, according to some embodiments.

A further variation is illustrated in FIG. 8, which depicts an image sensor 800, according to some embodiments. Image sensor 800 may include an image array 802, which may be a conventional image array that scans out intensity values for pixels. That image array may be adapted to provide differential image information as described herein through the use of comparator 806. Comparator 806 may, similarly to comparator 606, compute difference information based on stored values for the pixels. Selected ones of those difference values may be passed to output 812 by pixel filter 808. As with pixel filter 706, pixel filter 808 may receive control inputs from a patch tracking engine 804. Patch tracking engine 804 may be similar to patch tracking engine 704). Output 812 may be coupled to an image processor 810. Some or all of the above-mentioned components of the image sensor 800 may be implemented in a single integrated circuit. Alternatively, the components may be distributed across one or more integrated circuits or other components.

Figure 9:
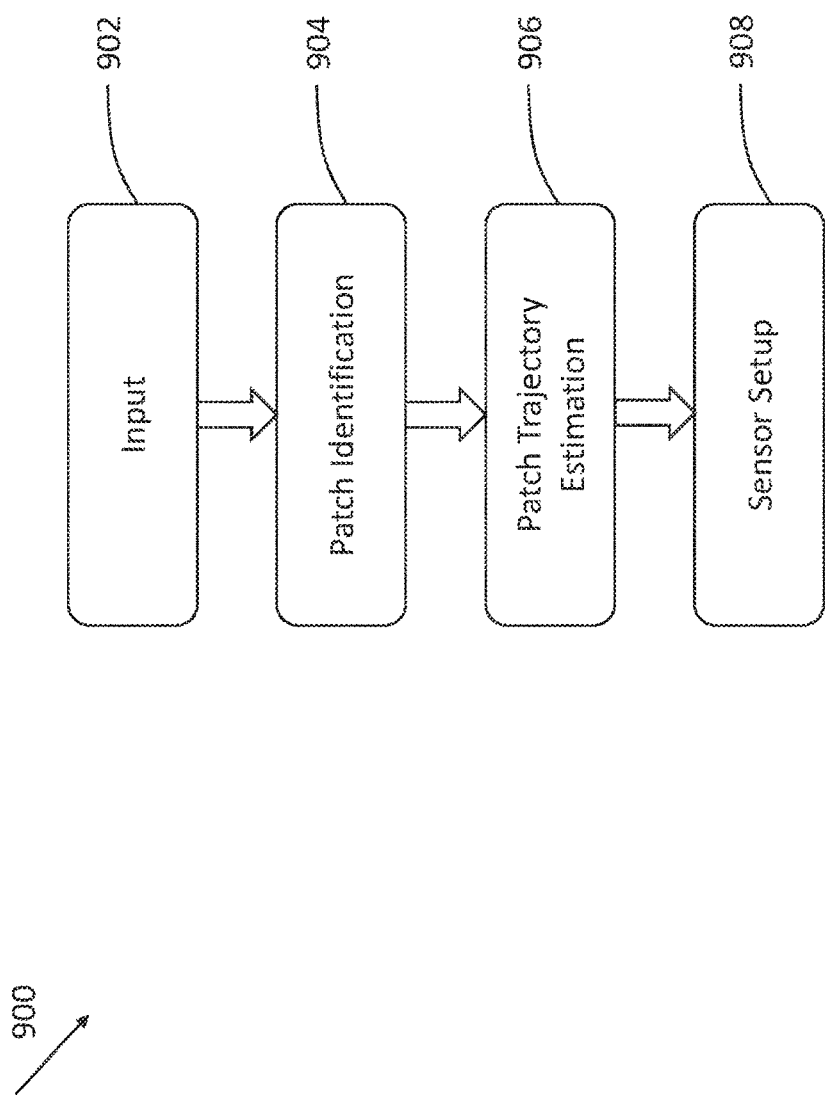
FIG. 9 is a simplified flow chart of a method for image sensing, according to some embodiments.

Image sensors as described herein may be operated as part of an augmented reality system to maintain information about movable objects or other information about a physical world useful in rendering images of virtual objects realistically in combination with information about a physical environment. FIG. 9 depicts a method 900 for image sensing, according to some embodiments.

Figure 10:
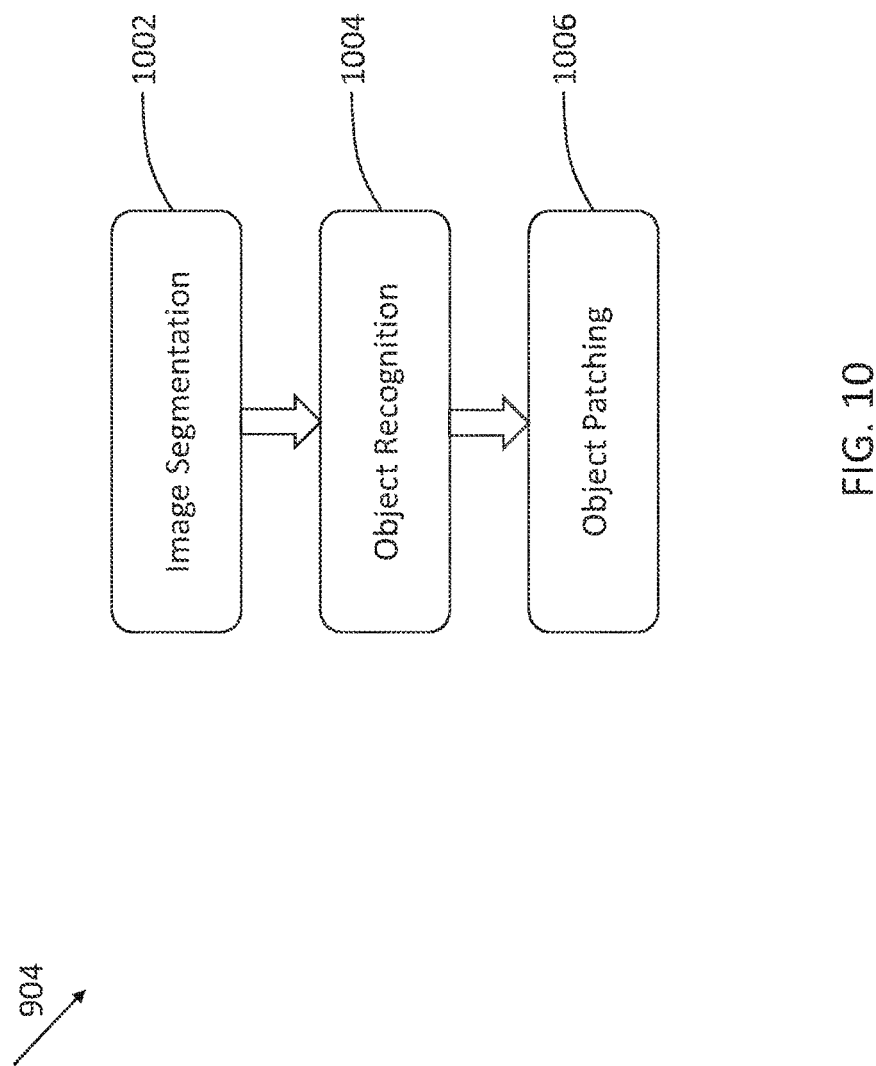
FIG. 10 is a simplified flow chart of the act of patch identification of FIG. 9, according to some embodiments.
Figure 11:
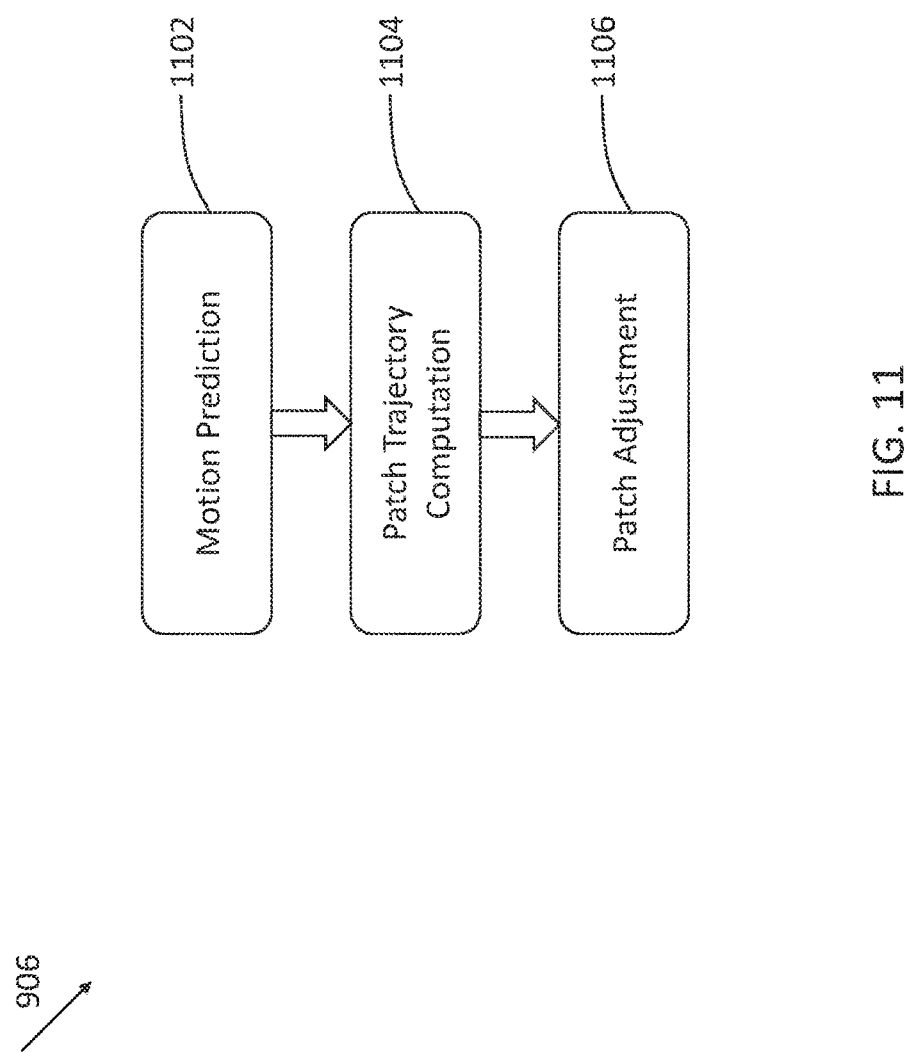
FIG. 11 is a simplified flow chart of the act of patch trajectory estimation of FIG. 9, according to some embodiments.

At least a part of the method 900 may be performed to operate an image sensor including, for example, the image sensors 400, 600, 700 or 800. The method 900 may start from receiving (act 902) imaging information from one or more inputs including, for example, the image sensors 412, inertial sensors 414, and stored information 416. The method 900 may include identifying (act 904) one or more patches on an image output of the image sensing system based at least in part on the received information. An example of act 904 is illustrated in FIG. 10. In some embodiments, the method 900 may include computing (act 906) moving trajectories for the one or more patches. An example of act 906 is illustrated in FIG. 11.

The method 900 may also include setting (act 908) the image sensing system based at least in part on the identified one or more patches and/or their estimated moving trajectories. The setup may be achieved by enabling a portion of pixel cells of the image sensing system based at least in part on the identified one or more patches and/or their estimated moving trajectories through, for example, the comparator 606, pixel filter 706 and so on. In some embodiments, the comparator 606 may receive a first reference voltage value for pixel cells corresponding to a selected patch on the image, and a second reference voltage value for pixel cells not corresponding to any selected patches on the image. The comparator 606 may set the second reference voltage to be much higher than the first reference voltage such that no reasonable light intensity changes sensed by a pixel cell, which has a comparator cell with the second reference voltage, can result in an output by the pixel cell. In some embodiments, the pixel filter 706 may disable outputs from pixel cells with addresses (e.g., row and column), which do not correspond to any selected patches on the image.

FIG. 10 depicts the patch identification 904, according to some embodiments. The patch identification 904 may include segmenting (act 1002) one or more images from the one or more inputs based at least in part on color, light intensity, angle-of arrival, depth, and semantic.

The patch identification 904 may also include recognizing (act 1004) one or more objects in the one or more images. In some embodiments, the object recognition 1004 may be based at least in part on predetermined features of the object including, for example, hand, eye, face features. In some embodiments, the object recognition 1004 may be based on one or more virtual objects. For example, a virtual animal character is walking on a physical pencil. The object recognition 1004 may target the virtual animal character as the object. In some embodiments, the object recognition 1004 may be based at least in part on artificial intelligence (AI) training received by the image sensing system. For example, the image sensing system may be trained by reading images of cats in different types and colors, and thus learned characteristics of a cat and capable of identifying a cat in a physical world.

The patch identification 904 may include generating (act 1006) the patch based on the one or more objects. In some embodiments, the object patching 1006 may generate the patch by computing convex hulls or bounding boxes for the one or more objects.

FIG. 11 depicts the patch trajectory estimation 906, according to some embodiments. The patch trajectory estimation 906 may include predicting (act 1102) movements for the one or more patches over time. The movements for the one or more patches may be caused by multiple reasons including, for example, a moving object and/or a moving user. The motion prediction 1102 may include deriving moving velocities for a moving object and/or a moving user based on received images and/or received AI training.

The patch trajectory estimation 906 may include computing (act 1104) trajectories for the one or more patches over time based at least in part on the predicted movements. In some embodiments, a trajectory may be computed by modeling with a first order linear equation, assuming an object in motion will continue moving with the same velocity in the same direction. In some embodiments, a trajectory may be computed by curve fitting or using heuristics, including pattern detection.

Figure 12:
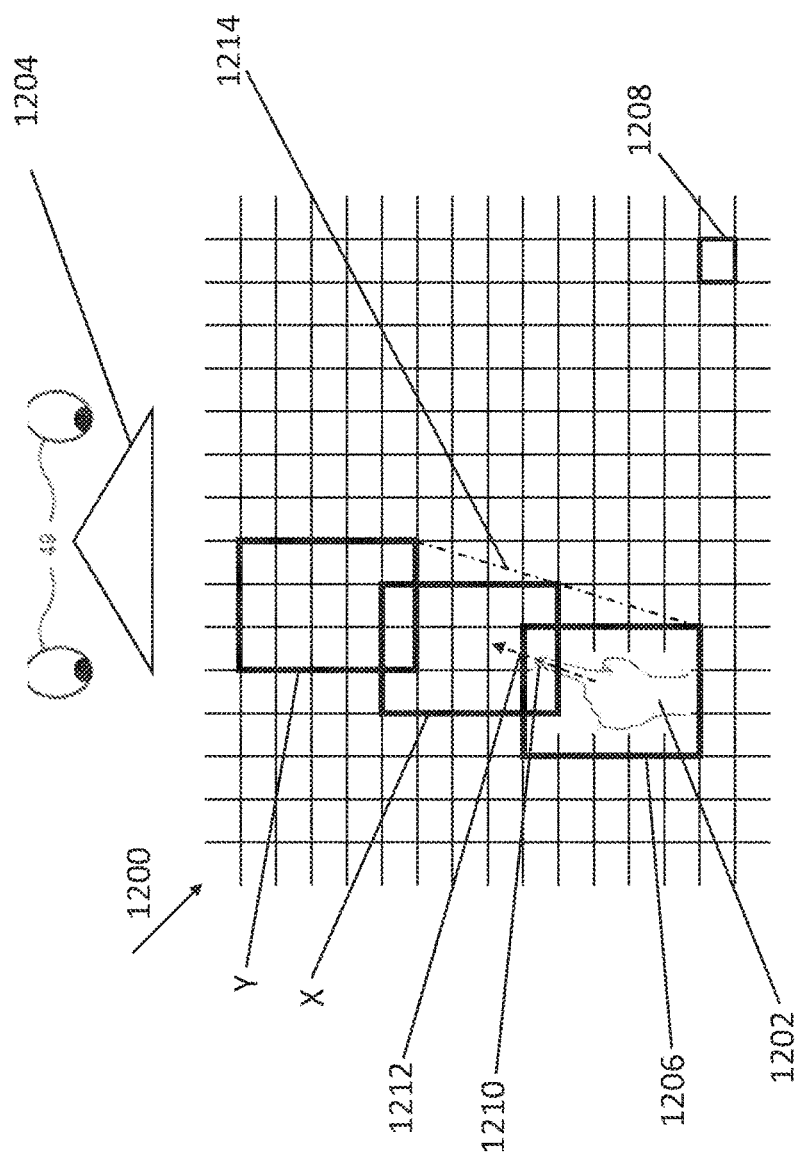
FIG. 12 is a schematic diagram illustrating the patch trajectory estimation of FIG. 11 with respect to one viewpoint, according to some embodiments.
Figure 13:
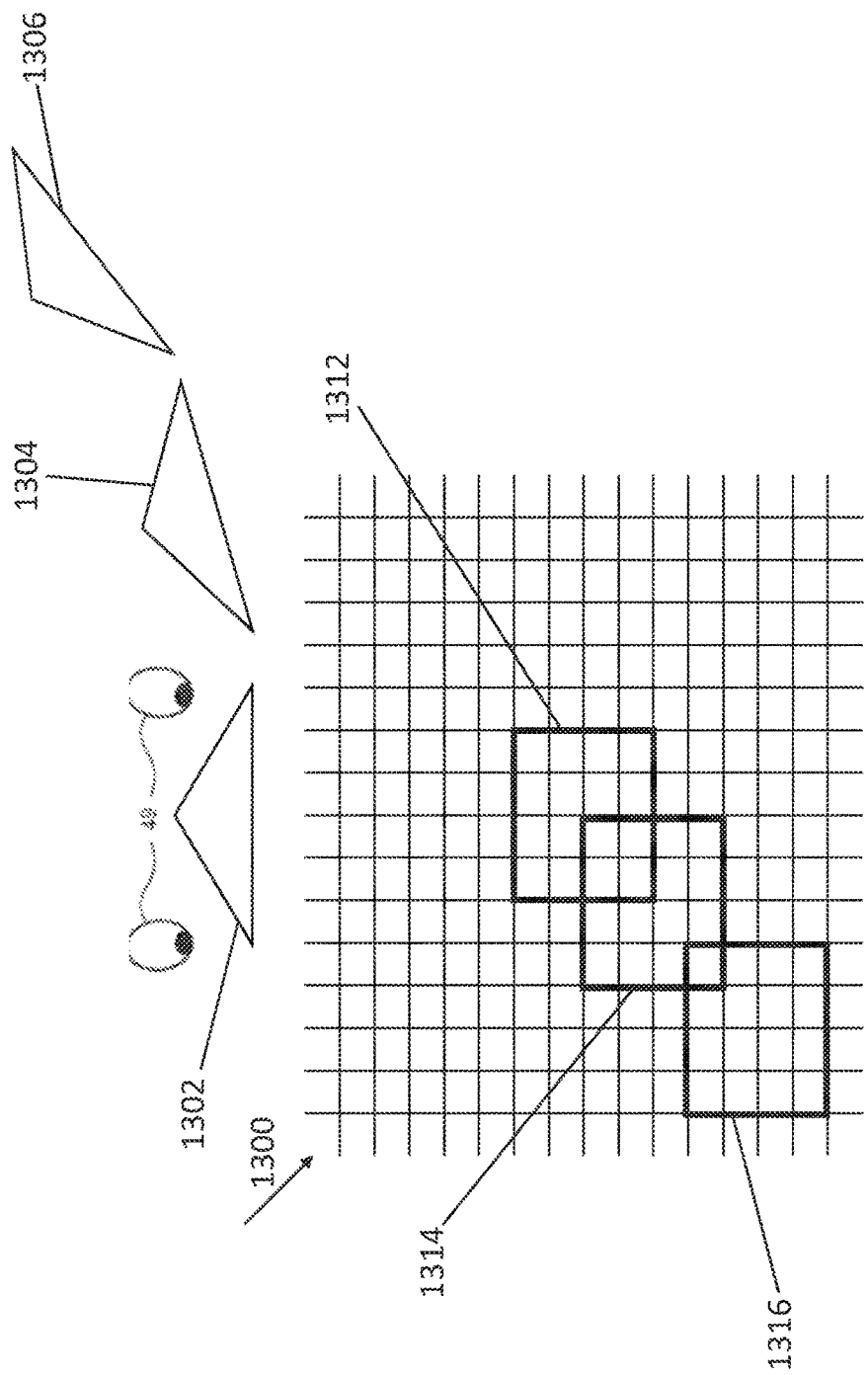
FIG. 13 is a schematic diagram illustrating the patch trajectory estimation of FIG. 11 with respect to viewpoint changes, according to some embodiments.

FIGS. 12 and 13 illustrate factors that may be applied in a calculation of patch trajectory. FIG. 12 depicts an example of a movable object, which in this example is moving object 1202 (e.g., a hand) that is moving relative to the user of an AR system. In this example, a user is wearing an image sensor as part of the head mounted display 62. In this example, the user's eyes 49 are looking straight ahead such that an image array 1200 captures a field of view (FOV) for eyes 49 with respect to one viewpoint 1204. Object 1202 is in the FOV and therefore appears, by creating intensity variations, in corresponding pixels in array 1200.

The array 1200 has a plurality of pixels 1208 arranged in an array. For a system tracking hand 1202, a patch 1206 in that array encompassing object 1202 at a time t0 may include a portion of the plurality of pixels. If object 1202 is moving, the location of a patch capturing that object will change over time. That change may be captured in a patch trajectory, from patch 1206 to patches X and Y used at later times.

The patch trajectory may be estimated, such as in act 906, by identifying a feature 1210 for the object in the patch, for example, a fingertip in the illustrated example. A motion vector 1212 may be computed for the feature. In this example, the trajectory is modeled as a first order linear equation and the prediction is based on an assumption that the object 1202 will continue on that same patch trajectory 1214 over time, leading to patch locations X and Y at each of two successive times.

As the patch location changes, the image of moving object 1202 stays within the patch. Even though image information is limited to information gathered with pixels within the patch, that image information is adequate to represent motion of the moving object 1202. Such will be the case whether the image information is intensity information or differential information as produced by a differencing circuit. In the case of a differencing circuit, for example, an event indicating an increase of intensity might occur as the image of moving object 1202 moves over a pixel. Conversely, when the image of moving object 1202 passes on from a pixel, an event indicating a decrease of intensity might occur. The pattern of pixels with increasing and decreasing events may be used as a reliable indication of motion of moving object 1202, that can be rapidly updated with low latency due to a relatively small amount of data indicating the events. As a specific example, such a system may lead to a realistic AR system that tracks a user's hand and alters the rendering of virtual objects to create the sense for the user that the user is interacting with the virtual objects.

A position of a patch may change for other reasons, and any or all of which may be reflected in the trajectory computation. One such other change is movement of the user when the user is wearing the image sensor. FIG. 13 depicts an example of a moving user, which creates a changing viewpoint for the user as well as the image sensor. In FIG. 13, the user may initially be looking straight ahead at an object with a view point 1302. In this configuration, a pixel array 1300 of an image array will capture objects in front of the user. An object in front of the user may be in patch 1312.

The user may then change the view point, such as by turning their head. The view point may change to view point 1304. Even if the object, previously directly in front of the user, does not move, it will have a different position within the field of view of the user at view point 1304. It will also be at a different point within the field of view of an image sensor worn by the user and therefore a different position within image array 1300. That object, for example, may be contained within a patch at location 1314.

If the user further changes their view point to view point 1306, and the image sensor moves with the user, the location of the object, previously directly in front of the user, will be imaged at a different point within the field of view of an image sensor worn by the user and therefore a different position within image array 1300. That object, for example, may be contained within a patch at location 1316.

As can be seen, as the user changes their viewpoint further, the position of the patch in the image array needed to capture an object moves further. The trajectory of this motion, from location 1312, to location 1314 to location 1316 may be estimated and used for tracking a future position of a patch.

The trajectory may be estimated in other ways. For example, when a user has a view point 1302, a measurement with inertial sensors may indicate the acceleration and velocity of the user's head. This information may be used to predict the trajectory of the patch within the image array based on motion of the user's heard.

The patch trajectory estimation 906 may predict that the user will have a viewpoint 1304 at time t1 and a viewpoint 1306 at time t2 based at least in part on these inertial measurements. Accordingly, the patch trajectory estimation 906 may predict the patch 1308 may move to patch 1310 at time t1 and patch 1312 at time t2.

As an example of such an approach, it may be used to provide accurate and low latency estimations of head pose in an AR system. The patch may be positioned to encompass the image of a stationary object within a user's environment. As a specific example, processing of image information may identify a corner of a picture frame hanging on a wall as a recognizable and stationary object to track. That processing may center a patch on that object. As with the case of moving object 1202, described above in connection with FIG. 12, relative movement between the object and the user's head, will produce events that can be used to compute the relative motion between the user and the tracked object. In this example, because the tracked object is stationary, the relative motion is indicating motion of the imaging array, which is being worn by the user. That motion, therefore, indicates a change in the user's head pose relative to the physical world and can be used to maintain an accurate computation of the user's head pose, which may be used in rendering virtual objects realistically. As an imaging array as described herein can provide rapid updates, with relatively small amounts of data per update, computations to render virtual objects remain accurate (they can be performed quickly and updated frequently).

Referring back to FIG. 11, The patch trajectory estimation 906 may include adjusting (act 1106) a size of at least one of the patches based at least in part on the computed patch trajectories. For example, the size of the patch may be set to be large enough that it includes the pixels where an image of a movable object, or at least a portion of an object for which image information is to be generated, will be projected. The patch may be set to be slightly larger than the projected size of the image of the portion of the object of interest such that if there are any errors in estimating the trajectory of the patch, the patch may nonetheless include the relevant portions of the image. As an object moves relative to an image sensor, the size of the image of that object, in pixels, may change based on distance, incidence angle, orientation of the object or other factors. A processor defining the patch associated with an object may set a size of the patch, such as by measuring, based on other sensor data, or computing based on a world model, a size of a patch relevant for an object. Other parameters of the patch, such as its shape, similarly may be set or updated.

Having thus described several aspects of some embodiments, it is to be appreciated that various alterations, modifications, and improvements will readily occur to those skilled in the art.

As one example, embodiments are described in connection with an augmented (AR) environment. It should be appreciated that some or all of the techniques described herein may be applied in an MR environment or more generally in other XR environments.

Also, embodiments of an image array are described in which one patch is applied to an image array to control the selective outputting of image information about one movable object. It should be appreciated that there may be more than one movable object in a physical embodiment. Further, in some embodiments, it may be desirable to selectively obtain frequent updates of image information in regions other than where a movable object is located. For example, a patch may be set to selectively obtain image information about a region of the physical world where a virtual object is to be rendered. Accordingly, some image sensors may be able to selectively provide information for two or more patches, with or without circuitry to track the trajectory of those patches.

As yet a further example, an image array is described as outputting information relating to the magnitude of incident light. Magnitude may be a representation of power across a spectrum of light frequencies. That spectrum may be relatively broad capturing energy at frequencies corresponding to any color of visible light, such as in a black and white camera. Alternatively, the spectrum may be narrow, corresponding to a single color of visible light. Filters to limit light incident on an image array to light of a particular color may be used for this purpose. Where pixels are limited to receiving light of specific colors, different pixels may be limited to different colors. In such embodiments, outputs of pixels sensitive to the same color may be processed together.

A process for setting a patch in an image array and then updating the patch for an object of interest was described. This process may be performed, for example, for each movable object as it enters a field of view of an image sensor. The patches may be cleared when the object of interest leaves the field of view, such that the patches are no longer tracked or such that no image information is output for the patch. It should be appreciated that from time to time a patch may be updated, such as by determining the location of the object associated with the patch and setting the position of the patch to correspond to that location. A similar adjustment can be made to a computed trajectory of a patch. The motion vector for an object and/or motion vector of the image sensor may be computed from other sensor information and used to reset the values programmed into the image sensor, or other component, for patch tracking.

For example, locations, motions and other characteristics of objects may be determined by analyzing the output of a wide angle video camera or a pair of video camera with stereoscopic information. Data from these other sensors may be used to update the world model. In connection with an update, the patch position and/or trajectory information may be updated. Such updates may occur at a lower rate than the position of the patch is updated by a patch tracking engine. The patch tracking engine, for example, may compute a new patch position at a rate between about 1 and 30 times per second. Updates to the patch position based on other information may occur at a slower rate, such as once per second up to about once per 30 second interval.

As yet a further example of a variation, FIG. 2 shows a system with a head mounted display separate from a remote processing module. An image sensor as described herein may lead to a compact design of the system. Such a sensor generates less data, which in turn leads to lower processing requirements and less power consumption. Less need for processing and power, enables size reduction such as by reducing the size of batteries. Accordingly, in some embodiments, the entire augmented reality system may be integrated in a head mounted display without a remote processing module. The head mounted display may be configured as a pair of goggles or, as shown in FIG. 2, may resemble in size and shape a pair of glasses.

Further, embodiments are described in which an image sensor responds to visible light. It should be appreciated that the techniques described herein are not limited to operation with visible light. They may alternatively or additionally be response to IR light or "light" in other parts of the spectrum, such as UV. Moreover, the image sensor as described herein is response to naturally occurring light. Alternatively or additionally, the sensor may be used in a system with a source of illumination. In some embodiments, the sensitivity of the image sensor may be tuned to the portion of the spectrum in which the source of illumination emits light.

As another example, it is described that a selected region of an image array for which changes should be output from an image sensor is specified by specifying a "patch" on which image analysis is to be performed. It should be appreciated, however, that the patch and the selected region may be of different sizes. The selected region, for example, may be larger than the patch to account for motion of objects in an image being tracked that deviates from the predicted trajectory and/or to enable processing around the edges of the patch.

As another example, a computing device is provided, the computing device comprising a support member, a sensor mechanically coupled to the support member, a processor operatively coupled to the sensor and configured to process image information from the sensor, and a patch trajectory computing engine coupled to the sensor. The sensor may comprise a plurality of pixel cells generating image information for respective regions in a field of view of the sensor. The patch trajectory computing engine may be configured to dynamically compute a portion of the plurality of pixel cells representing a patch based on information indicating the patch at a first time and information indicating a trajectory of the patch subsequent to the first time, and selectively enable image information from the dynamically computed portion of the plurality of pixel cells to be coupled to the processor at times subsequent to the first time.

In such a computing device, the patch trajectory computing engine may be configured to estimate a trajectory for the patch and enable portions of the plurality of pixel cells of the sensor at different timestamps based at least in part on the estimated trajectory for the patch. The image information may comprise a plurality of images, and the trajectory may be estimated based at least in part on the plurality of images. The computing device may further comprise at least one inertial sensor, and the trajectory may be estimated based at least in part on information from the at least one inertial sensor. In some embodiments, the patch may be a first patch, and the portion of the plurality of pixel cells may be a first portion of the plurality of pixel cells. The patch trajectory computing engine may be configured to identify a second patch corresponding to a second portion of the plurality of pixel cells, based at least in part on the first patch and the trajectory, and selectively enable a portion of image information from the plurality of pixel cells based at least in part on the second patch. The second portion of the plurality of pixel cells may include a larger number of pixel cells than the first portion of the plurality of pixel cells.

As another example, a method of operating a computing system is provided, the computing system comprising a sensor worn by a user and a processor configured to process image information, the sensor comprising a plurality of pixel cells generating image information for respective regions in a field of view of the sensor. The method may comprise analyzing one or more images depicting the vicinity of the user; identifying, based on analyzing the images, an object in the vicinity of the user; identifying a patch based at least in part on a portion of the identified object; and selectively providing, from the sensor to the processor, image information from a portion of the plurality of pixel cells based at least in part on correspondence between the patch and the portion of the plurality of pixel cells. In some embodiments, the object may comprise a physical element. In some embodiments, the object may comprise a virtual element.

In some embodiments, identifying the patch may comprise segmenting the one or more images, recognizing one or more objects in the one or more images, and generating the patch based on the one or more objects. In some embodiments, segmenting the one or more images may comprise segmenting the one or more images by color, light intensity, angle-of-arrival, depth, and/or semantic. In some embodiments, the one or more objects comprises predetermined features and/or a virtual character. In some embodiments, generating the patch may comprise generating a minimum bounding box for the one or more objects.

Such alterations, modifications, and improvements are intended to be part of this disclosure, and are intended to be within the spirit and scope of the disclosure. Further, though advantages of the present disclosure are indicated, it should be appreciated that not every embodiment of the disclosure will include every described advantage. Some embodiments may not implement any features described as advantageous herein. Accordingly, the foregoing description and drawings are by way of example only.

The above-described embodiments of the present disclosure can be implemented in any of numerous ways. For example, the embodiments may be implemented using hardware, software or a combination thereof. When implemented in software, the software code can be executed on any suitable processor or collection of processors, whether provided in a single computer or distributed among multiple computers. Such processors may be implemented as integrated circuits, with one or more processors in an integrated circuit component, including commercially available integrated circuit components known in the art by names such as CPU chips, GPU chips, microprocessor, microcontroller, or co-processor. In some embodiments, a processor may be implemented in custom circuitry, such as an ASIC, or semicustom circuitry resulting from configuring a programmable logic device. As yet a further alternative, a processor may be a portion of a larger circuit or semiconductor device, whether commercially available, semi-custom or custom. As a specific example, some commercially available microprocessors have multiple cores such that one or a subset of those cores may constitute a processor. Though, a processor may be implemented using circuitry in any suitable format.

Further, it should be appreciated that a computer may be embodied in any of a number of forms, such as a rack-mounted computer, a desktop computer, a laptop computer, or a tablet computer. Additionally, a computer may be embedded in a device not generally regarded as a computer but with suitable processing capabilities, including a Personal Digital Assistant (PDA), a smart phone or any other suitable portable or fixed electronic device.

Also, a computer may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible format. In the embodiment illustrated, the input/output devices are illustrated as physically separate from the computing device. In some embodiments, however, the input and/or output devices may be physically integrated into the same unit as the processor or other elements of the computing device. For example, a keyboard might be implemented as a soft keyboard on a touch screen. In some embodiments, the input/output devices may be entirely disconnected from the computing device, and functionally integrated through a wireless connection.

Such computers may be interconnected by one or more networks in any suitable form, including as a local area network or a wide area network, such as an enterprise network or the Internet. Such networks may be based on any suitable technology and may operate according to any suitable protocol and may include wireless networks, wired networks or fiber optic networks.

Also, the various methods or processes outlined herein may be coded as software that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine.

In this respect, the disclosure may be embodied as a computer readable storage medium (or multiple computer readable media) (e.g., a computer memory, one or more floppy discs, compact discs (CD), optical discs, digital video disks (DVD), magnetic tapes, flash memories, circuit configurations in Field Programmable Gate Arrays or other semiconductor devices, or other tangible computer storage medium) encoded with one or more programs that, when executed on one or more computers or other processors, perform methods that implement the various embodiments of the disclosure discussed above. As is apparent from the foregoing examples, a computer readable storage medium may retain information for a sufficient time to provide computer-executable instructions in a non-transitory form. Such a computer readable storage medium or media can be transportable, such that the program or programs stored thereon can be loaded onto one or more different computers or other processors to implement various aspects of the present disclosure as discussed above. As used herein, the term "computer-readable storage medium" encompasses only a computer-readable medium that can be considered to be a manufacture (i.e., article of manufacture) or a machine. In some embodiments, the disclosure may be embodied as a computer readable medium other than a computer-readable storage medium, such as a propagating signal.

The terms "program" or "software" are used herein in a generic sense to refer to any type of computer code or set of computer-executable instructions that can be employed to program a computer or other processor to implement various aspects of the present disclosure as discussed above. Additionally, it should be appreciated that according to one aspect of this embodiment, one or more computer programs that when executed perform methods of the present disclosure need not reside on a single computer or processor, but may be distributed in a modular fashion amongst a number of different computers or processors to implement various aspects of the present disclosure.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that conveys relationship between the fields. However, any suitable mechanism may be used to establish a relationship between information in fields of a data structure, including through the use of pointers, tags or other mechanisms that establish relationship between data elements.

Various aspects of the present disclosure may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Also, the disclosure may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. A method of operating a computing system comprising a sensor worn by a user and a processor configured to process image information, the sensor comprising an image array of a plurality of pixel cells generating image information for respective regions in a field of view of the sensor, the method comprising:
   analyzing one or more images depicting a vicinity of the user;
   identifying, based on analyzing the one or more images, an object in a physical world in the vicinity of the user;
   identifying a portion of the plurality of pixel cells as a patch representing at least a portion of the identified object;
   estimating a trajectory of the patch among the plurality of pixels with respect to coordinates of the image array, the estimating comprising:
      constructing a model of the object's motion in the physical world and a model of the image array's motion with respect to the physical world; and computing the trajectory based on the model of the object's motion within the physical world and the model of the image array's motion with respect to the physical world;

dynamically updating a location of the patch among the plurality of pixels based on the estimated trajectory of the patch by updating which of the plurality of pixel cells is included in the patch while the computing system is operating; and controlling the sensor to selectively provide, to the processor, image information from the portion of the plurality of pixel cells in the patch without providing image information from pixels of the plurality of pixels that are outside of the patch.

2. The method of claim 1, wherein:

the portion of the plurality of pixel cells of the sensor is a first portion of the plurality of pixel cells, and the method further comprises:

estimating a trajectory of the patch based at least in part on objects represented by the portion of the plurality of pixels of the one or more images; and enabling a plurality of portions of the plurality of pixel cells of the sensor at different times based at least in part on the estimated trajectory of the patch, wherein the plurality of portions of the plurality of pixel cells comprise the first portion of the plurality of pixel cells.

3. The method of claim 2, wherein:

estimating the trajectory for the patch comprises:

predicting one or more motion vectors for the objects and/or the user; and computing the trajectory for the patch based at least in part on the predicted one or more motion vectors.

4. The method of claim 3, wherein:

estimating the trajectory for the patch further comprises dynamically adjusting a size of the patch based at least in part on the estimated trajectory.

5. The method of claim 1, wherein:

obtaining the one or more images comprises obtaining the one or more images from another sensor and/or a storage memory.

6. The method of claim 1, wherein controlling the sensor to selectively provide, to the processor, the image information from the portion of pixels in the patch without providing the image information from the pixels that are outside of the patch comprises:

providing signals to the portion of pixels in the patch to enable output of information from the portion of pixels without providing signals to the pixels that are outside of the patch.

7. The method of claim 6, wherein:

each of the plurality of pixels comprises a comparator, the comparator comprising an enable input; and providing the signals to the portion of pixels in the patch to enable output of information from the portion of pixels comprises providing the signals to enable inputs of comparators in the portion of pixels in the patch.

8. The method of claim 1, wherein estimating the trajectory of the patch among the plurality of pixels comprises estimating the trajectory of the patch based on motion of the object.

9. A method of operating a computing system comprising a sensor worn by a user and a processor configured to process image information, the sensor comprising an image array of a plurality of pixel cells generating image information for respective regions in a field of view of the sensor, the method comprising:

analyzing one or more images depicting a vicinity of the user;

identifying, based on analyzing the one or more images, an object in a physical world in the vicinity of the user;

identifying a patch based at least in part on a portion of the identified object;

selectively providing, from the sensor to the processor, image information from a portion of the plurality of pixels based at least in part on correspondence between the patch and the portion of the plurality of pixel cells;

estimating a trajectory of the patch among the plurality of pixels with respect to coordinates of the image array, the estimating comprising:

constructing a model of the object's motion in the physical world and a model of the image array's motion with respect to the physical world; and computing the trajectory based on the model of the object's motion within the physical world and the model of the image array's motion with respect to the physical world; and enabling a plurality of portions of the plurality of pixels cells of the sensor at different times based at least in part on the estimated trajectory of the path, wherein the plurality of portions of the plurality of pixel cells comprises the portion of the plurality of pixel cells, wherein enabling the portion of the plurality of pixel cells of the sensor comprises setting a first threshold value for the portion of the plurality of pixel cells and a second threshold for pixel cells outside the portion, the second threshold being greater than the first threshold.

10. A method of operating a computing system comprising a sensor worn by a user and a processor configured to process image information, the sensor comprising an image array of a plurality of pixel cells generating image information for respective regions in a field of view of the sensor, the method comprising:

analyzing one or more images depicting a vicinity of the user;

identifying, based on analyzing the one or more images, an object in a physical world in the vicinity of the user;

identifying a portion of the plurality of pixel cells as a patch representing at least a portion of the identified object;

selectively providing, from the sensor to the processor, image information from the portion of the plurality of pixels based at least in part on correspondence between the patch and the portion of the plurality of pixel cells;

estimating a trajectory of the patch among the plurality of pixels, with respect to coordinates of the image array, based at least in part on the object represented by the portion of the plurality of pixels of the one or more images, the estimating comprising:

constructing a model of the object's motion in the physical world and a model of the image array's motion with respect to the physical world; and computing the trajectory based on the model of the object's motion within the physical world and the model of the image array's motion with respect to the physical world; and updating a location of the patch among the plurality of pixels at least in part by enabling a plurality of portions of the plurality of pixels cells of the sensor at different times based at least in part on the estimated trajectory of the path, wherein the plurality of portions of the plurality of pixel cells comprises the portion of the plurality of pixel cells, wherein the different times are determined based at least in part on a shape of the estimated trajectory for the patch.

11. A computing device comprising:
a support member;
a sensor mechanically coupled to the support member, the sensor comprising an image array of a plurality of pixel cells generating image information for respective regions in a field of view of the sensor;
a processor, operatively coupled to the sensor and configured to process image information from the sensor;
a patch trajectory computing engine coupled to the sensor, the patch trajectory computing engine configured to:
estimate a trajectory of a patch of pixels among the plurality of pixels with respect to coordinates of the image array, the estimating comprising:
constructing a model of an object's motion in a physical world and a model of the image array's motion with respect to the physical world; and
computing the trajectory based on the model of the object's motion within the physical world and the model of the image array's motion with respect to the physical world;
dynamically modify a portion of the plurality of pixel cells included in the patch based on information indicating a position of the patch among the plurality of pixels at a first time and information indicating the trajectory of the patch among the plurality of pixels subsequent to the first time; and
in a time period subsequent to the first time:
control the sensor to selectively provide, to the processor, image information from the portion of the plurality of pixel cells in the patch without providing image information from pixel cells of the plurality of pixel cells that are outside of the patch.

12. The computing device of claim 11, wherein:
the sensor comprises a dynamic vision sensor (DVS).

13. The computing device of claim 11, wherein:
the sensor comprises a transmissive diffraction mask (TDM).

14. The computing device of claim 11, wherein:
the sensor is a first sensor,
the plurality of pixel cells is a first plurality of pixel cells, and
the computing device further comprises a second sensor coupled to the support member, the second sensor comprising a second plurality of pixel cells, and configured to output frames at fixed time intervals.

15. The computing device of claim 14, wherein:
the patch trajectory computing engine is further configured to selectively enable image information from the second plurality of pixel cells to be coupled to the processor at times subsequent to the first time.

16. The computing device of claim 11, further comprising:
at least one memory, wherein the patch trajectory computing engine is further configured to selectively enable image information from the at least one memory to be coupled to the processor at times subsequent to the first time.

17. The computing device of claim 11, wherein controlling the sensor to selective provide, to the processor, the image information from the portion of pixels in the patch without providing the image information from the pixels that are outside of the patch comprises:
providing signals to the portion of pixels in the patch to enable output of information from the portion of pixels without providing signals to the pixels that are outside of the patch.

18. The computing device of claim 17, wherein the plurality of pixel cells each comprises a comparator, the comparator comprising an enable input.

19. The computing device of claim 18, wherein providing the signals to the portion of pixels in the patch to enable output of information from the portion of pixels comprises providing the signals to enable inputs of comparators of the portion of pixels in the patch.

* * * * *